(12) United States Patent
Crozier et al.

(10) Patent No.: US 9,429,634 B2
(45) Date of Patent: Aug. 30, 2016

(54) MRI COIL DESIGN WITH VOLUMETRIC TROUGH-SHAPED COIL ELEMENTS

(75) Inventors: Stuart Crozier, St Lucia (AU); Bing Keong Li, St Lucia (AU); Feng Liu, Forest Lake (AU); Ewald Weber, Alexandra Hills (DE)

(73) Assignee: University of Queensland, St. Lucia, Queensland (AU)

( * ) Notice: Subject to any disclaimer, the term of this patent is extended or adjusted under 35 U.S.C. 154(b) by 1307 days.

(21) Appl. No.: 12/936,682

(22) PCT Filed: Apr. 7, 2009

(86) PCT No.: PCT/AU2009/000422
§ 371 (c)(1),
(2), (4) Date: Dec. 5, 2011

(87) PCT Pub. No.: WO2009/124340
PCT Pub. Date: Oct. 15, 2009

(65) Prior Publication Data
US 2012/0074935 A1    Mar. 29, 2012

(30) Foreign Application Priority Data
Apr. 7, 2008 (AU) ................................ 2008901638

(51) Int. Cl.
*G01R 33/3415* (2006.01)
*G01R 33/34* (2006.01)
*G01R 33/36* (2006.01)
*G01R 33/561* (2006.01)

(52) U.S. Cl.
CPC ... *G01R 33/34046* (2013.01); *G01R 33/34007* (2013.01); *G01R 33/3415* (2013.01); *G01R 33/365* (2013.01); *G01R 33/5611* (2013.01)

(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 4,751,464 A * | 6/1988 | Bridges | ................ 324/318 |
| 4,825,162 A | 4/1989 | Roemer | |
| 5,280,249 A | 1/1994 | Kess | |

(Continued)

FOREIGN PATENT DOCUMENTS

| DE | 10 2005 036513 | 8/2006 |
|---|---|---|
| WF | WO 2006/094354 | 9/2006 |

(Continued)

OTHER PUBLICATIONS

B.K. Li et al., "High Frequency Electromagnetic Analysis using Hybrid MOM/FEM Method", Proceedings of the International Society for Magnetic Resonance in Medicine, 14th Scientific Meeting and Exhibition, Seattle, Washington, USA, May 6-12, 2006, Apr. 22, 2006, p. 699.

(Continued)

*Primary Examiner* — Melissa Koval
*Assistant Examiner* — Tiffany Fetzner
(74) *Attorney, Agent, or Firm* — Paul Vincent

(57) ABSTRACT

A coil for a magnetic resonance imaging device consists of multiple coil elements arranged about an imaging space. Each coil element comprise radiating structures oriented at an angle to a tangent of the imaging space. Angling the radiating structures reduces mutual coupling between coil elements and enhances the penetration of the radio frequency field to the imaging space.

11 Claims, 30 Drawing Sheets

(56) References Cited

U.S. PATENT DOCUMENTS

| | | | |
|---|---|---|---|
| 5,347,220 A * | 9/1994 | Van Heelsbergen | 324/318 |
| 5,483,163 A | 1/1996 | Wen | |
| 5,489,847 A | 2/1996 | Nabeshima | |
| 6,011,393 A * | 1/2000 | Kaufman et al. | 324/318 |
| 6,087,832 A * | 7/2000 | Doty | 324/318 |
| 6,285,189 B1 * | 9/2001 | Wong | 324/318 |
| 6,377,047 B1 * | 4/2002 | Wong et al. | 324/318 |
| 7,427,861 B2 * | 9/2008 | Bogdanov et al. | 324/318 |
| 7,432,711 B2 * | 10/2008 | Du et al. | 324/318 |
| 7,446,528 B2 * | 11/2008 | Doddrell et al. | 324/318 |
| 7,646,199 B2 * | 1/2010 | Dannels et al. | 324/318 |
| 7,859,264 B2 * | 12/2010 | Wosik et al. | 324/318 |
| 8,022,705 B2 * | 9/2011 | Bogdanov | 324/318 |
| 8,106,656 B2 * | 1/2012 | Wosik et al. | 324/318 |
| 8,390,287 B2 * | 3/2013 | Crozier | G01R 33/34046 324/309 |
| 8,598,877 B2 * | 12/2013 | Fujimoto | 324/318 |
| 8,648,597 B2 * | 2/2014 | Habara et al. | 324/318 |
| 2003/0193380 A1 | 10/2003 | De Swiet | |
| 2004/0155656 A1 | 8/2004 | Leussler | |
| 2005/0062472 A1 * | 3/2005 | Bottomley | 324/317 |
| 2006/0119358 A1 * | 6/2006 | Doddrell et al. | 324/318 |
| 2006/0250125 A1 * | 11/2006 | Bogdanov et al. | 324/200 |
| 2007/0085634 A1 * | 4/2007 | Du et al. | 333/219.2 |
| 2007/0282194 A1 | 12/2007 | Wiggins | |
| 2008/0211498 A1 * | 9/2008 | Dannels et al. | 324/309 |
| 2009/0099444 A1 * | 4/2009 | Bogdanov | 600/422 |
| 2010/0182009 A1 * | 7/2010 | Crozier | G01R 33/34046 324/322 |
| 2010/0253347 A1 * | 10/2010 | Habara et al. | 324/318 |
| 2011/0124507 A1 * | 5/2011 | Wosik et al. | 505/162 |
| 2012/0074935 A1 * | 3/2012 | Crozier et al. | 324/307 |

FOREIGN PATENT DOCUMENTS

| | | |
|---|---|---|
| WO | WO 01/94964 | 12/2001 |
| WO | WO 2005/111645 | 11/2005 |
| WO | WO 2008/104019 | 9/2008 |
| WO | WO 2009050650 A2 * | 4/2009 |

OTHER PUBLICATIONS

Suwit Saekho et al., "Small Tip Angle Three-Dimensional Tailored Radiofrequency Slab-Select Pulse for Reduced $B_1$ Inhomogeneity at 3 T", Magnetic Resonance in Medicine 53:479-484 (2005).

Ulrich Katscher et al., "Transmit Sense", Magnetic Resonance in Medicine 49:144-150 (2003).

D.I. Hoult, "The Principle of Reciporcity in Signal Strength Calculations—A Mathematical Guide", Concepts Magn Reson 12: 173-187, 2000.

Mark A. Griswold et al., "Generalized Autocalibrating Partially Parallel Acquisitions (GRAPPA)", Magnetic Resonance in Medicine 47:1202-1210 (2002).

Hiroyuki Fujita, "New Horizons in MR Technology: RF Coil Designs and Trends", Magn Reson Med Sci, vol. 6, No. 1, pp. 29-42, 2007.

* cited by examiner

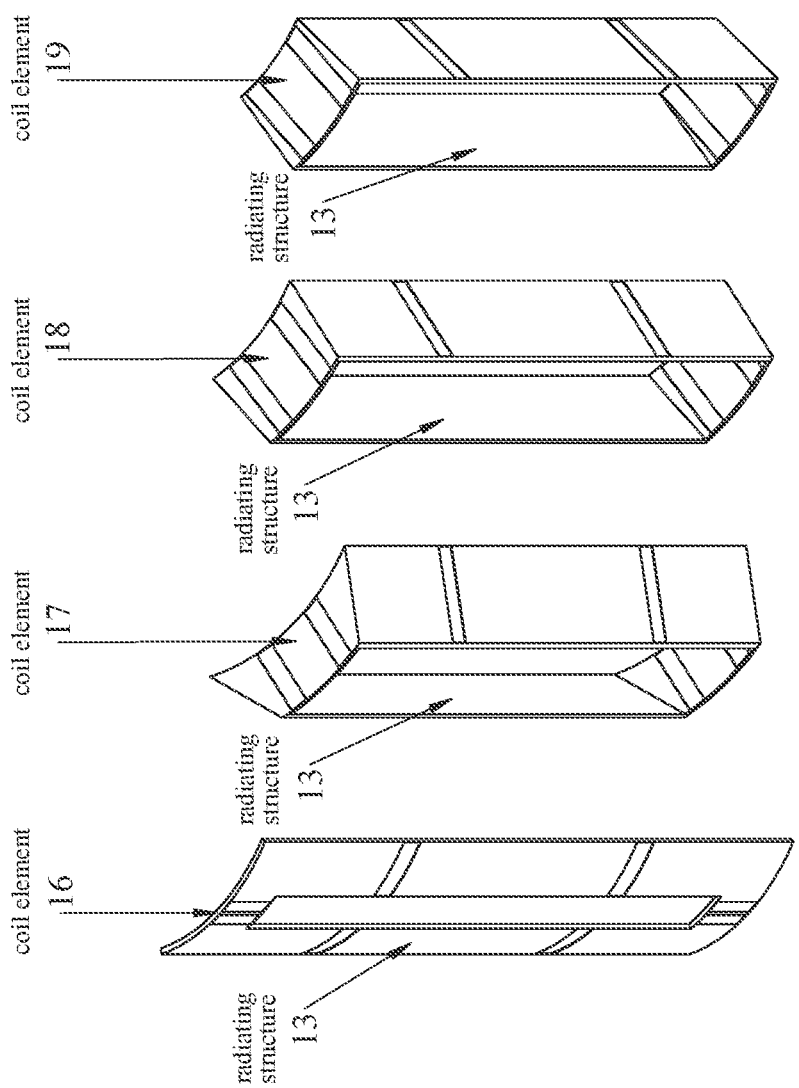

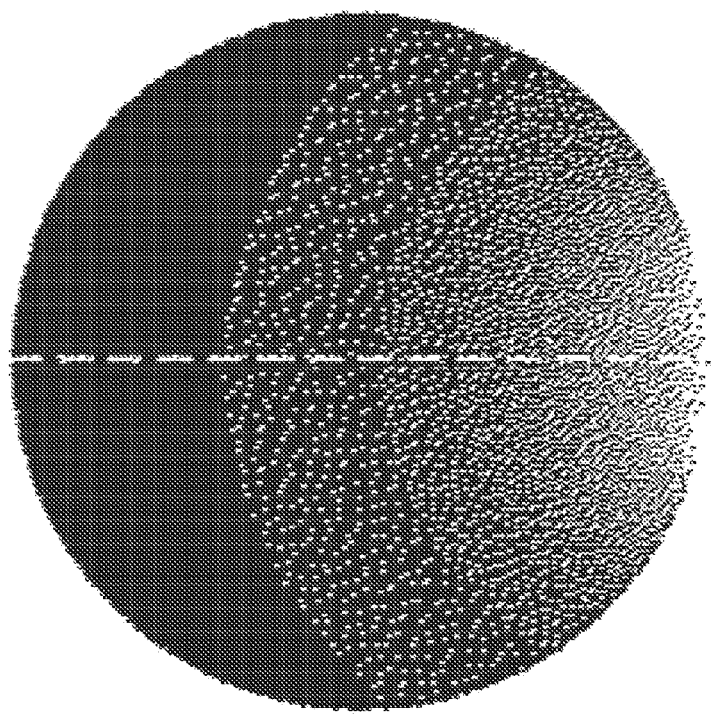
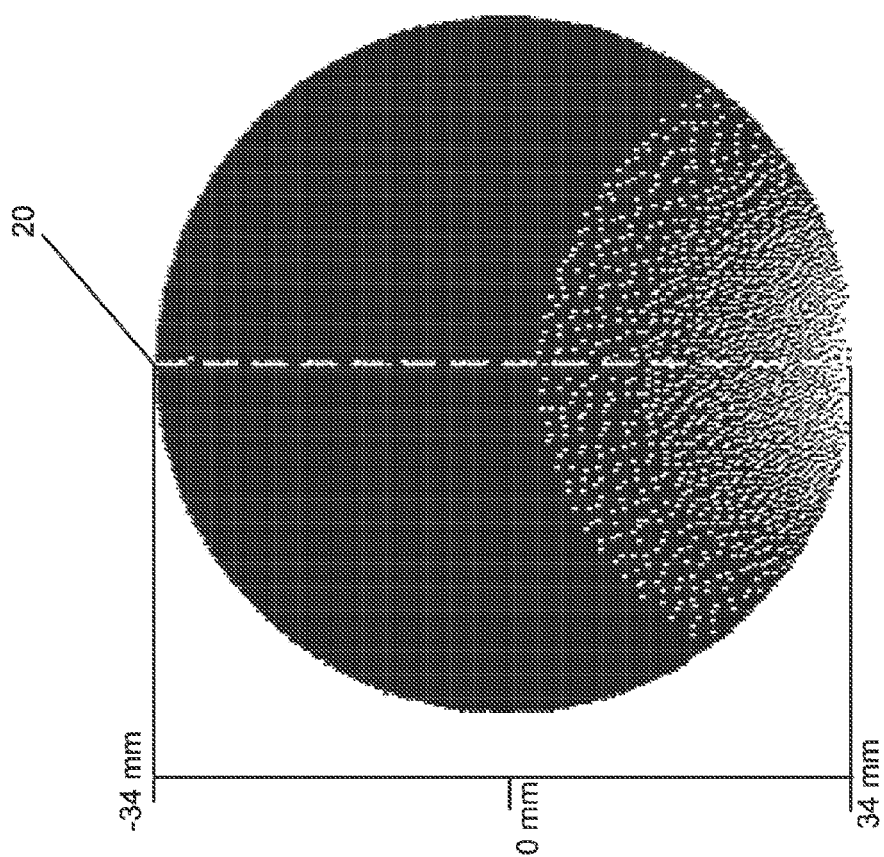
Fig. 4(a)
Fig. 4(b)

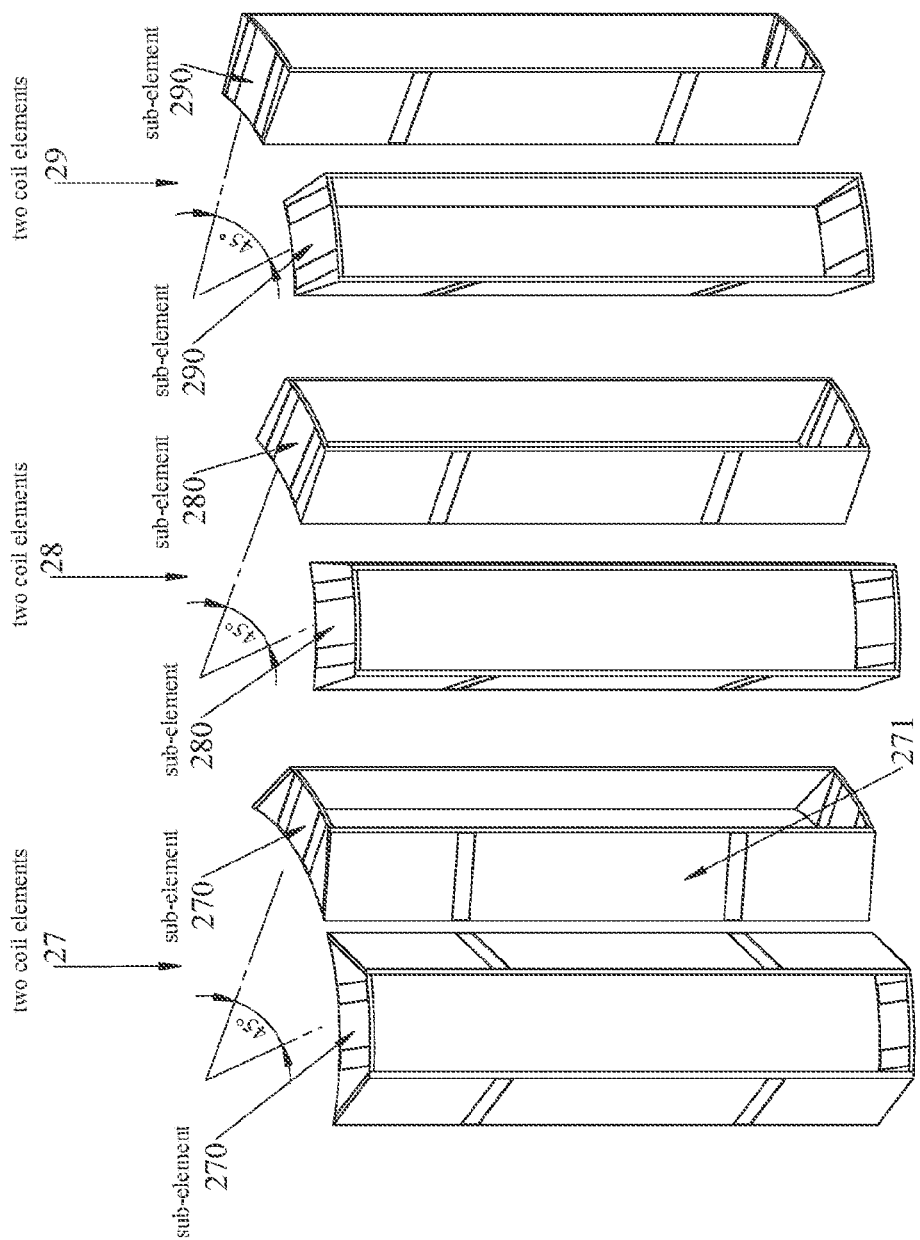

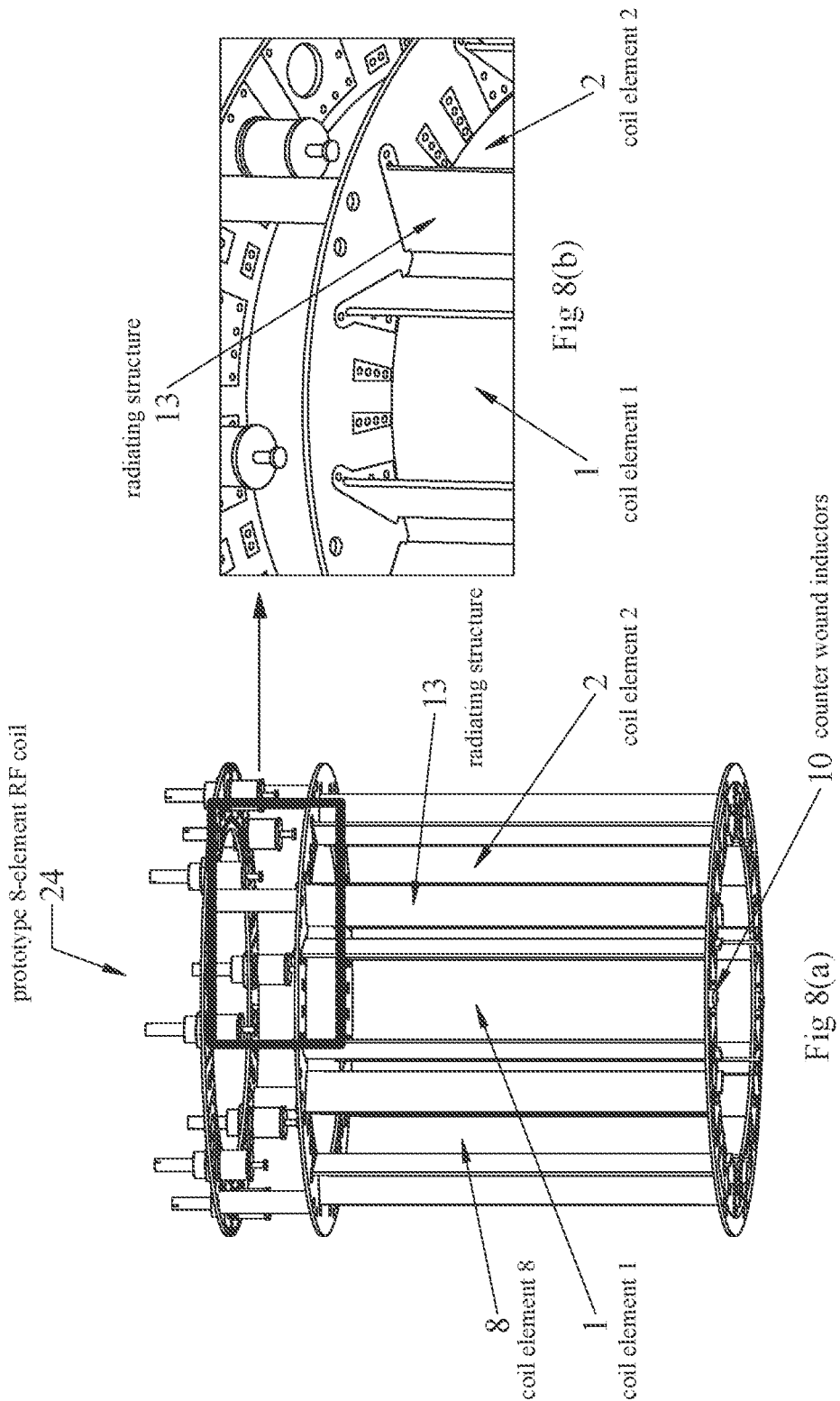

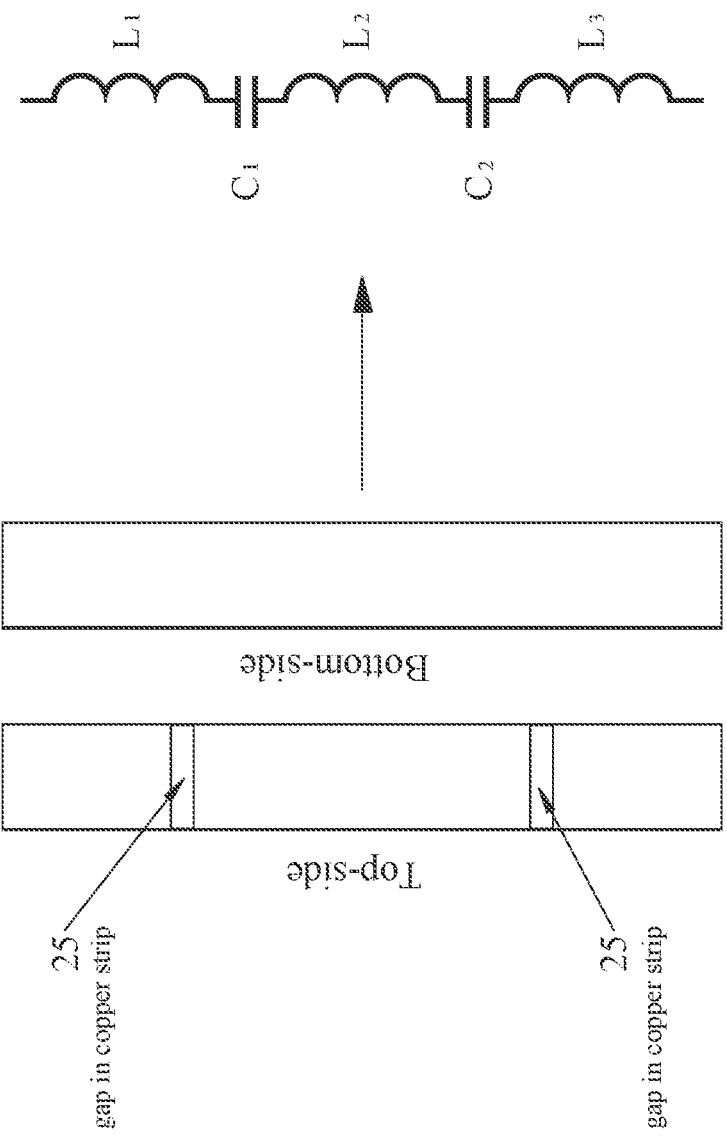

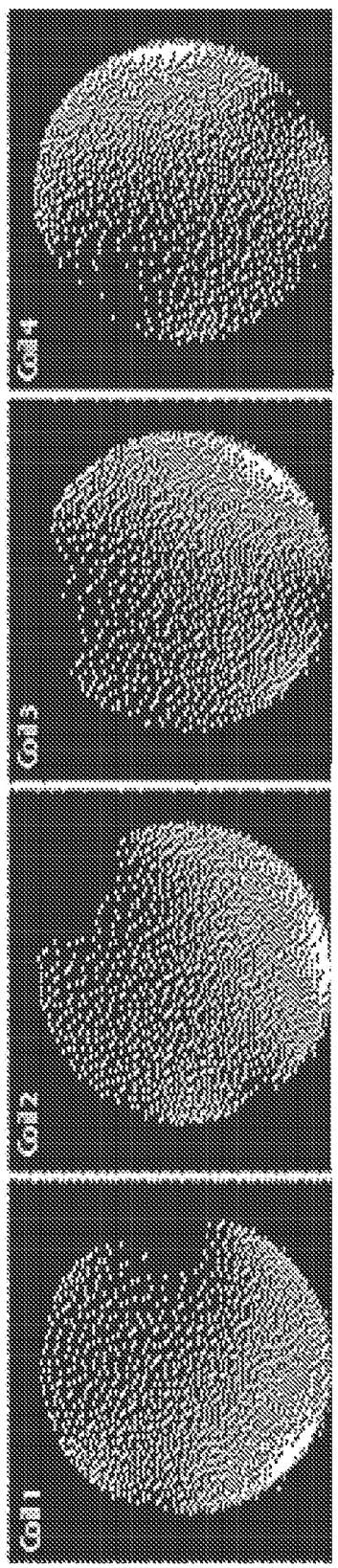

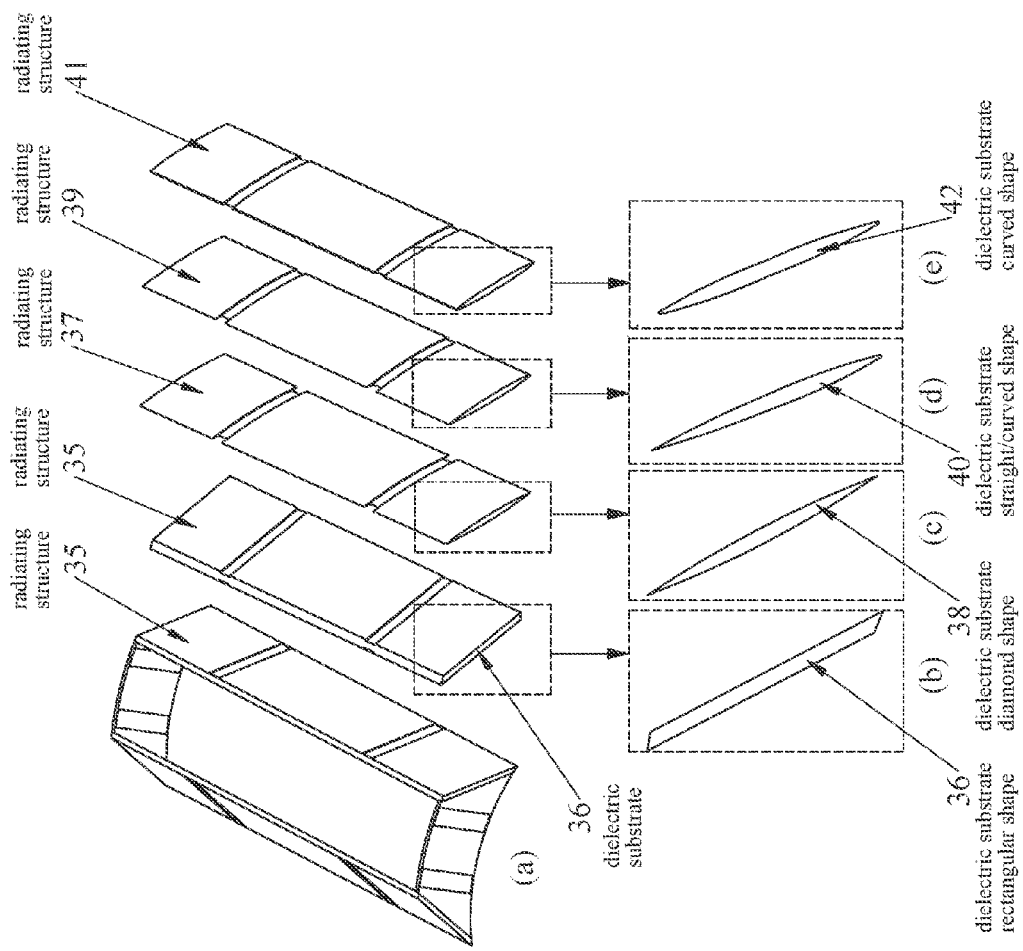

MRI COIL DESIGN WITH VOLUMETRIC TROUGH-SHAPED COIL ELEMENTS

FIELD OF INVENTION

The invention relates to an ultra-high frequency multi-element parallel transceive RF coil for use in a magnetic resonance imaging (MRI) system. In particular, the invention relates to a coil structure where the radiating elements of a multi-channel transceive MRI RF coil are optimally oriented to an angle relative to the imaging space to increase the penetration depth of RF fields and to reduce mutual coupling effect so that coil elements can be substantially decoupled. Compared with conventional phased array systems, the new layout of the coil can offer superior RF performance for strongly physically constrained situations, such as dense array RF systems for high-field animal and human MRI. The invention is well suited but not limited to multi-channel, parallel transceive RF coils.

BACKGROUND TO THE INVENTION

Field/tissue interactions become pronounced at ultra-high field MRI, causing increased RF inhomogeneity. The magnitudes of the inhomogeneity worsen if the dimensions of the sample coincide with the operating wavelength of the radio frequency fields. However, the advantages of being able to gain improved signal-to-noise ratio (SNR) and spectral resolution nevertheless favour the move towards high field MRI. Hence, to benefit from these advantages, the RF inhomogeneity should be ameliorated. A particular method, active RF shimming, which uses spatially selective pulses [Saekho et al, Magn Reson Med 53(2) pg 479-484, 2005] has been shown to yield significant improvement but there are issues associated with this method, explicitly the use of long duration pulses. This, however, can be circumvented through the use of parallel transmission techniques such as Transmit SENSE [Katscher et al, Magn Reson Med 49(1) pg 144-150, 2003], which require dedicated multi-element RF coils and independently controlled transmit/receive units.

In our previous international patent application number (PCT/AU2006/000311), a focusing scheme is described for a multi-element RF system that can increase the quality of images obtained for local regions of interest. The invention is described with reference to a number of small local coils with particular application to the head and chest.

Multi-element RF coils designed for active parallel transmission can be broadly classified into two categories. Multi-element RF coils which are specifically designed for the transmission only of the spatially selective pulses, while having a secondary receive-only RF coil for the reception of the excited MR signals, or, as a transceive system which can be used for transmission and reception simultaneously. The latter having the advantage of not requiring additional RF coils.

One common design element that all multi-element RF coils share is that some form of mutual decoupling method is employed to decouple the coil elements. A multi-element RF coil usually displays strong mutual coupling between individual coil elements. Some of the undesirable effects include difficulty in tuning and reduced SNR. RF field distortion is also a cause of image artefacts. Hence, minimizing mutual coupling is important.

In our pending international patent application number PCT/AU2008/000245, a counter wound inductor decoupling method is described for minimizing mutual coupling. The invention is described with reference to a number of local coils with particular application to the head. In the new coil structure described herein we preferentially use this method of decoupling, however, other methods of decoupling may be used with the new coil structure. The content of the previous application is incorporated herein by reference.

One other important consideration is the structural design of the coil element itself, the goal being a shape which can produce the highest possible RF field inside a conductive sample. This is crucial for active RF shimming, since ideally sufficient RF energy needs to be presented over the entire region of the sample to successfully excite protons over any region-of-interest (ROI). As the effective penetration depth of the RF field is proportional to the size of the coil element it is sometimes difficult to achieve the desired energy distribution, especially when the ROI is in the centre of the sample.

Irrespective of the applications (e.g. human or pre-clinical imaging) the design principles of a multi-element transmit and/or receive RF system remain the same. With strong spatial constraints, however, conventional coil structures can fail to produce a homogeneous RF field profile and even prove physically infeasible to construct. New designs are required.

OBJECT OF THE INVENTION

It is an object of the invention to provide a coil design for a multi-element RF system.

It is a further object to provide a coil design with good RF field penetration and reduced mutual coupling effects such that coil elements can be substantially decoupled.

The invention is well suited for transceiver, multi-element RF systems for active parallel transmission MRI applications. The RF coil systems can also be used for transmit-only and receive-only multi-element RF coils for partial parallel imaging applications.

Further objects will be evident from the following description.

DISCLOSURE OF THE INVENTION

In one form, although it need not be the only nor indeed the broadest form, the invention resides in a radio frequency coil comprising:
multiple volumetric trough-shaped coil elements arranged about an imaging space;
each volumetric trough-shaped coil element comprising radiating structures aligned at an angle relative to a tangent of the imaging space.

The radio frequency coil design is preferably adapted for magnetic resonance imaging.

Suitably the imaging space is cylindrical and the multiple volumetric trough-shaped coil elements are arranged about the circumference of the cylindrical space. Each radiating structure is suitably angled relative to a tangent of the circumference of the cylindrical space.

The radiating structures are suitably rectangular and the long side of the radiating structure is angled relative to a tangent to the circumference of the cylindrical space.

The angularly oriented radiating structures may further comprise distributed inductance and capacitance elements. Furthermore, the inductance and capacitance elements are suitably incorporated in each volumetric trough-shaped coil element and suitably oriented at an angle to enhance radio frequency field penetration to the space.

The distributed inductance and capacitance of the radiating structures may be adjusted so that the multi-element radio frequency coil can be used at ultra-high field strengths.

The volumetric trough-shaped coil elements may suitably comprise sub-elements.

BRIEF DETAILS OF THE DRAWINGS

To assist in understanding the invention, preferred embodiments will now be described with reference to the following figures in which:

FIG. 1 (a-b) shows a shielded eight-element parallel transceive RF coil with the long side radiating structures of the each volumetric trough-shaped coil element oriented at an angle to a tangent of the imaging space and where a counter wound inductor decoupling circuit is used for mutual decoupling. (a) shows a side view with half of the shielding removed to show the eight coils. (b) shows a top view of the shielded 8-element parallel transceive RF coil.

FIG. 2 (a-d) shows four different coil elements with their long side radiating structures oriented at various angles.

FIG. 6 (a-c) shows volumetric trough-shaped coil elements located in a diametric plane of the cylindrical space each having two sub-elements with an angle between the sub-elements being 45°.

FIG. 8 (a-d) shows the constructed prototype shielded eight-element parallel transceive RF coil incorporating the embodiments of the invention where the long side radiating structures of each volumetric trough-shaped coil element are oriented at approximately 62.5° and the capability of adjusting the inductance and capacitance is indicated.

FIGS. 15(a), 15(b) and 15(c) show various embodiments of radiating structures having different shapes.

Figure 16:
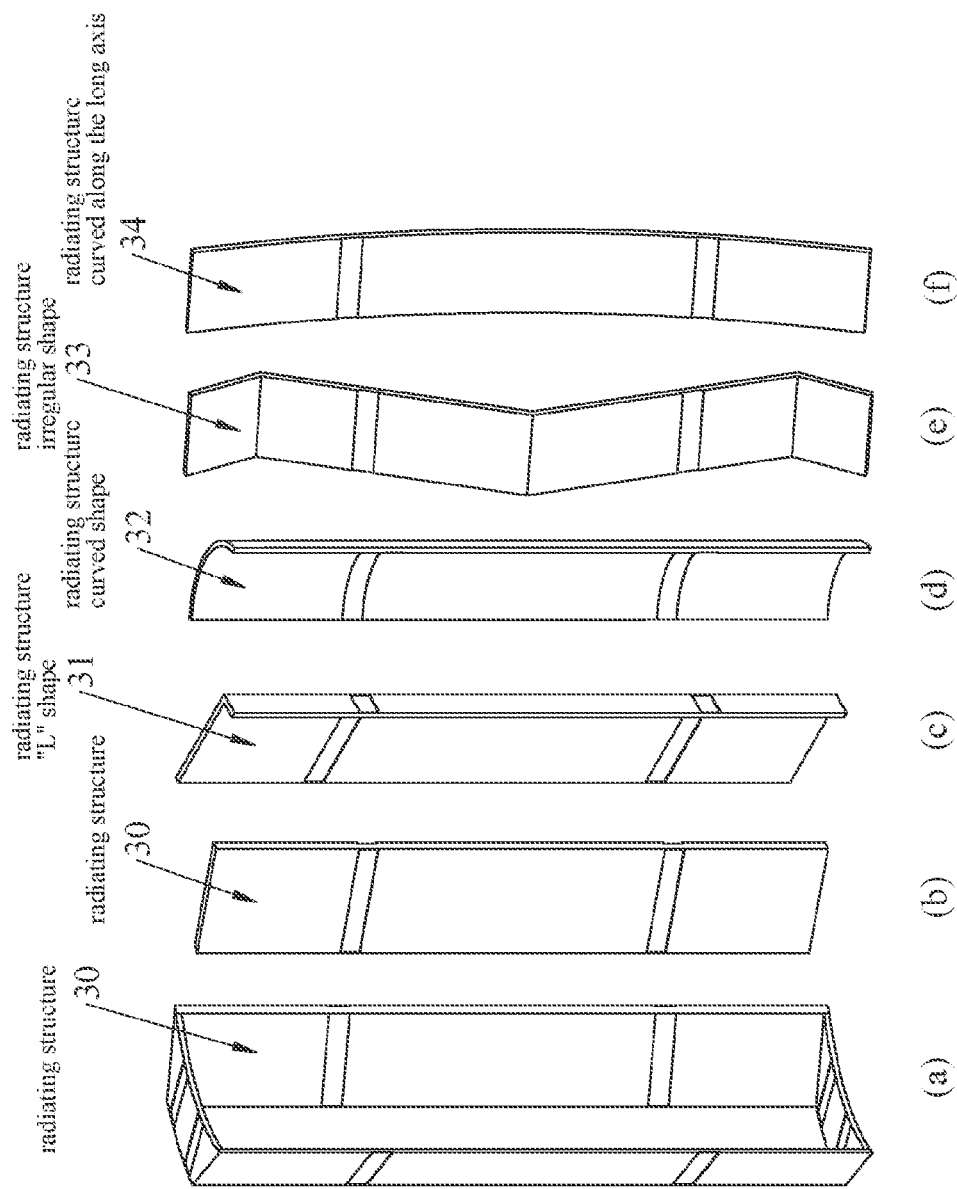

FIG. 16 (a-f) shows additional embodiments of radiating structures having different shapes.

FIG. 17 (a-e) shows embodiments of various radiating structures having differing construction.

DETAILED DESCRIPTION OF THE DRAWINGS

In describing different embodiments of the present invention, common reference numerals are used to describe like features. The current invention has been applied to the design and construction of a 9.4T shielded 8-element parallel transceive RF coil for pre-clinical MRI.

The transceive RF coil has been numerically modelled and a prototype constructed as described below. The invention is, however, not limited to animal MRI multi-element parallel transceive type of RF coils but can be applied to all multi-element or volumetric types of MRI RF coils.

Figure 1A:
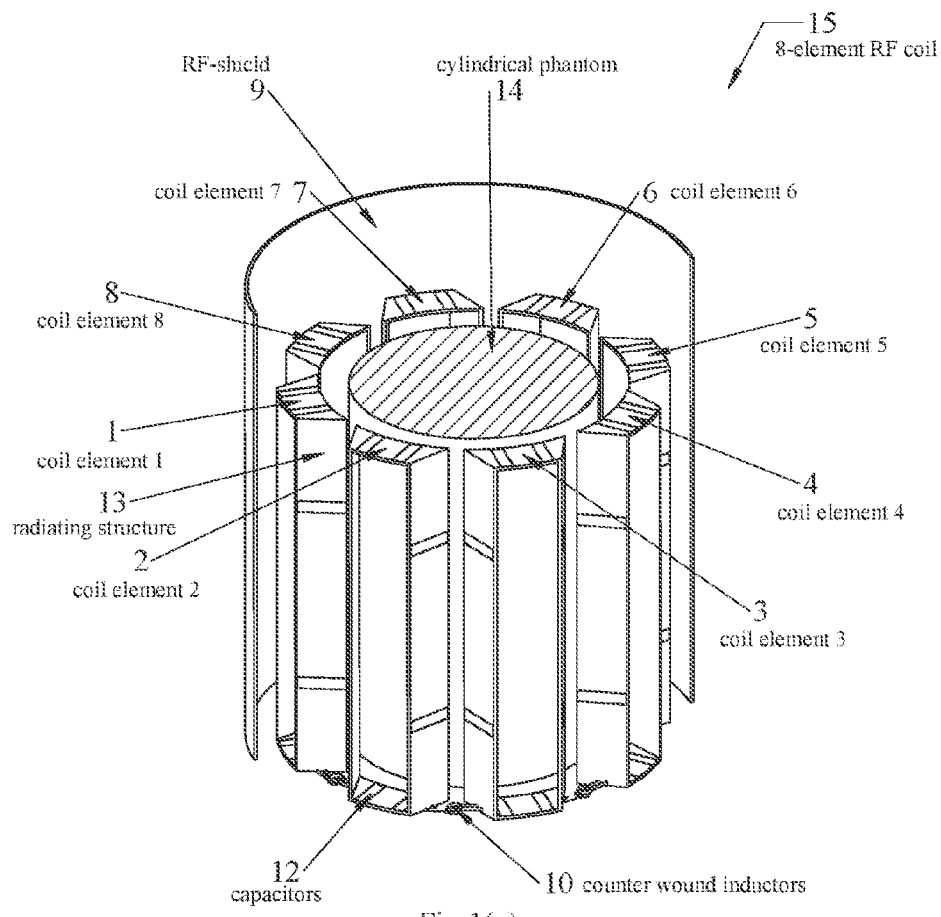
Figure 1B:
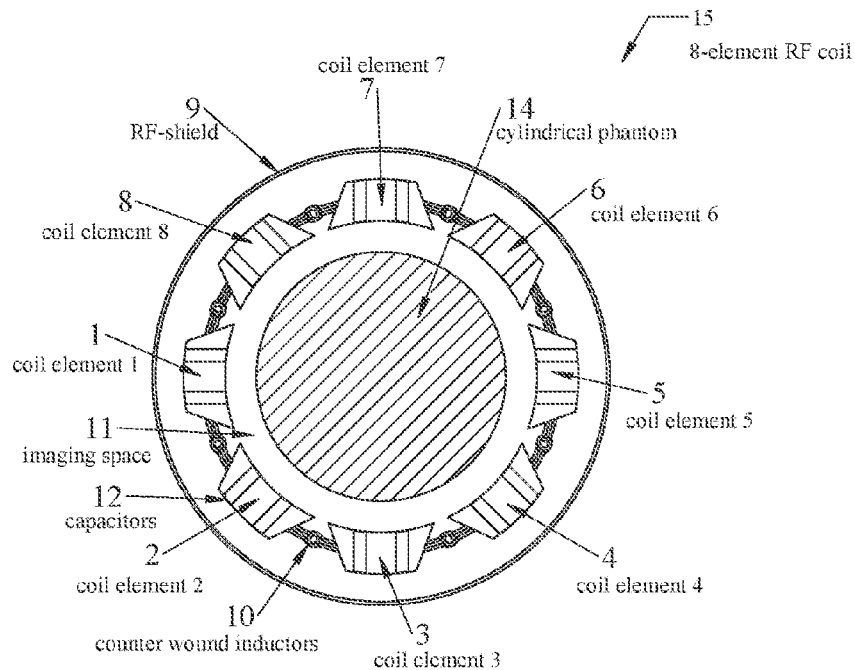
Figure 3D:
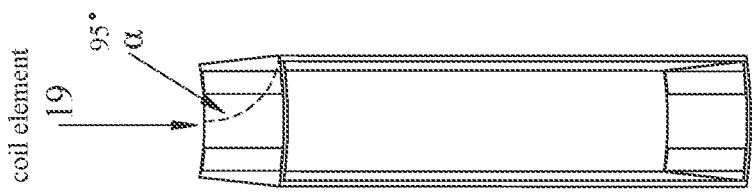
FIG. 3 (a-d) shows the four different structured coil elements of FIG. 2(a-d) viewed from a different angle.
Figure 3C:
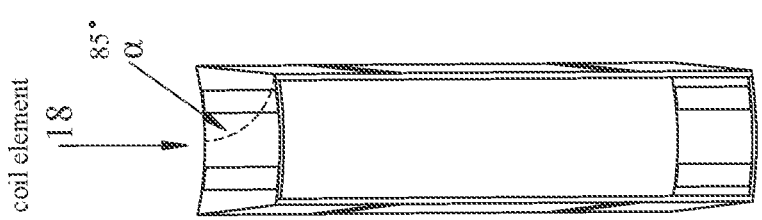
Figure 3B:
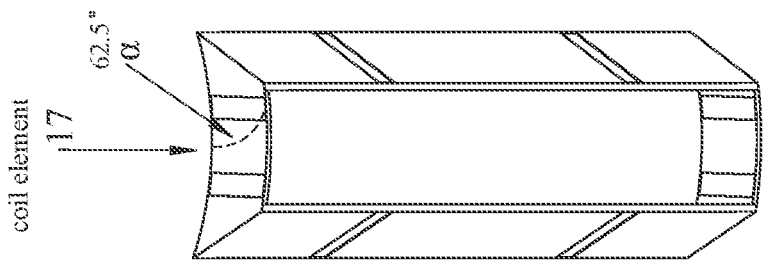
Figure 3A:
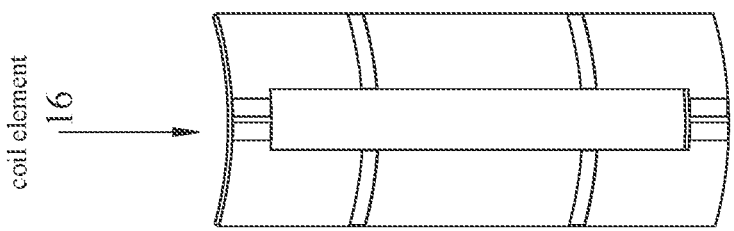

The shielded 8-element parallel transceive RF coil 15 consists of eight separate oblong coils 1, 2, 3, 4, 5, 6, 7, 8 as shown in FIG. 1. (Persons skilled in the art will understand that FIG. 1 is an illustrative representation of the concept only, not the actual design of the prototype coil). FIG. 1(b) is the top view of FIG. 1(a). The RF shielding 9 measured 109 mm in diameter and 200 mm in length. Note that half of the shielding is removed in FIG. 1(a) to show all volumetric trough-shaped coil elements. The volumetric trough-shaped coil elements are mutually decoupled using counter wound inductors 10 as explained in our pending international patent application number PCT/AU2008/000245 and are located in a diametric plane (suitably above or below) the imaging space 11 which is cylindrical with a diameter of 75.2 mm. The coils are spaced equi-angularly around the cylindrical imaging space with the angle between the nearest neighbouring coil being 360°/N, where N is the number of volumetric trough-shaped coil elements. Distributed capacitors 12 are inserted around the volumetric trough-shaped coil element and are used for tuning the coil element to resonate at 400 MHz and matching it to system impedance of 50Ω.

The imaging space 11 is not limited to being cylindrical although this is an appropriate shape for most relevant applications.

Each volumetric trough-shaped coil element comprises two radiating structures 13. The radiating structures of each volumetric trough-shaped coil element 1, such as shown in FIG. 1(b), are oriented at an angle α relative to a tangent, t, of the imaging space 11. As will be discussed below, this orientation increases the RF field at the centre of the cylindrical imaging space 11 concomitantly regulating the mutual coupling between neighbouring coils to a minimum.

Numerical Modelling

Based on a conceptual consideration of angularly orienting the long side radiating structures of each volumetric trough-shaped coil element relative to a tangent of the imaging space, a combined finite difference time domain (FDTD) and hybrid method of moments (MoM)/finite element method (FEM) method are employed for modelling and analysis. The FDTD software, an in-house product, is used for seeking the general resonator layout, while MoM/FEM software, commercially available from FEKO (EMSS, Stellenbosch, South Africa), is employed for the theoretical validation of coil performance.

Initially, FDTD is used for searching the optimum angle α to which the long side radiating structures 13 of all eight elements will be oriented relative to a tangent of the cylindrical imaging space 11. At this step, during the full-wave field calculation, the coil structure is replaced by ideal current sources assuming all the volumetric trough-shaped coil elements are resonant and can be replaced by identical current. The FDTD software is integrated with a nonlinear least square optimization algorithm to achieve maximum RF field at the centre of the cylindrical imaging space 11, by adjusting the orientation angle α. Note that during the FDTD optimisation process, the loading effect (tissue-equivalent phantom) and RF shielding is fully considered and accounted for.

Once the optimum angle α is determined, a full-wave hybrid MoM/FEM based RF simulation program, is then employed for modelling the realistic shielded 8-element parallel transceive RF coil and also used for calculating the RF field and the mutual coupling inside the same phantom. The rationale in using hybrid MoM/FEM method for modelling the transceive RF coil is described in our pending international patent application number PCT/AU2008/000245.

Depicted in FIG. 1 is the designed and modelled shielded 8-element parallel transceive RF coil 15. A homogenous cylindrical phantom 14, 54 mm in diameter, with dielectric properties of σ=0.2 S/m and ∈$_r$=76, which simulates a reasonable sample load, is also included.

Maximizing the RF Field

To demonstrate that the invention can increase the RF field penetration, four RF fields calculated using four different structured coil elements, where their long side radiating structures 13 are oriented to four different angles, are calculated and compared. Only one single element is analytically simulated for this comparison purpose.

Shown in FIG. 2(a-d) are the modelled four different structured coil elements 16, 17, 18, 19 with their long side radiating structures 13 oriented to various angles relative to a tangent of the cylindrical imaging space 11. Coil element 16 has no angle to its long side radiating structures 13 and is the conventional design method that is used for current RF coil design. In contrast, coil elements 17, 18, 19 are designed with their long side radiating structures 13 oriented outwards to various angles of 62.5°, 85° and 95° respectively.

FIG. 3(a-d) further elucidate the embodiment, showing the outwards orientation of the long side radiating structures 13 to three different angles α as mentioned previously.

Figure 4D:
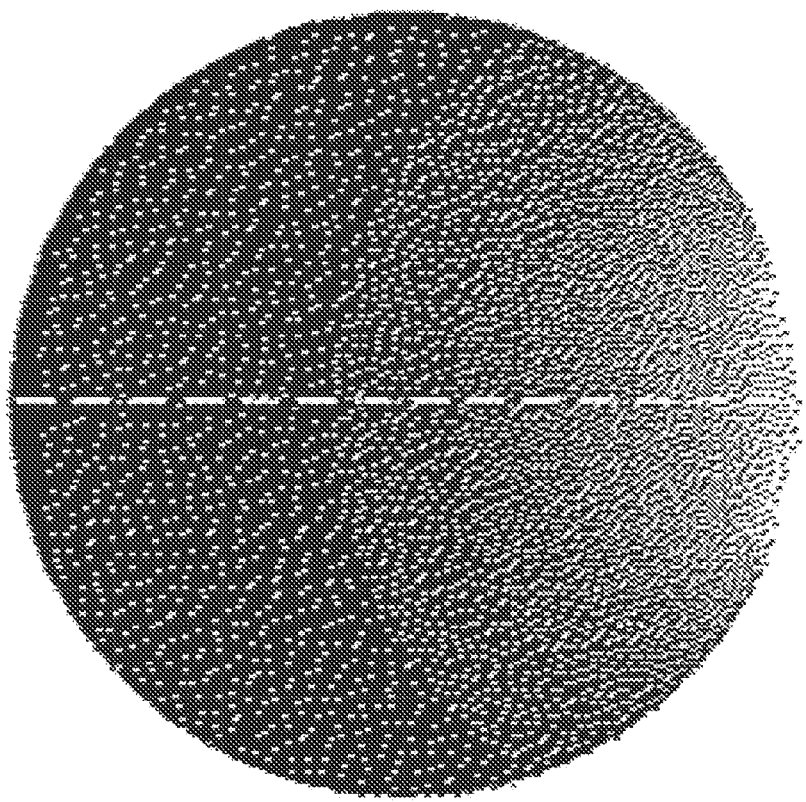
FIG. 4 (a-d) shows the calculated RF fields of the four different coil elements of FIG. 3(a-d).
Figure 4C:
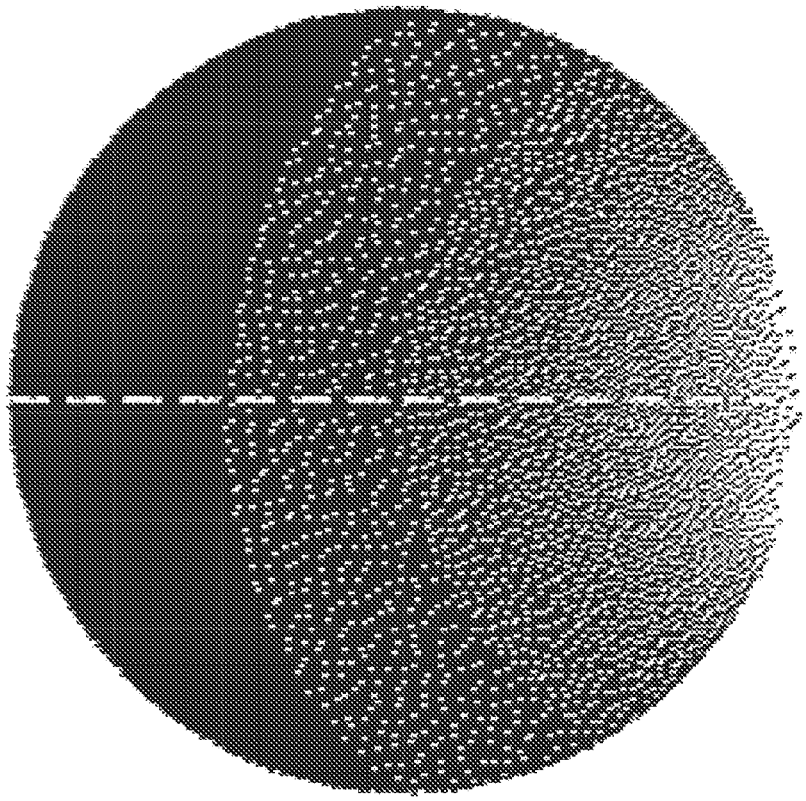

Using the modelled four different structured coil elements of FIG. 3(a-d), the RF fields induced by each coil element is calculated. Shown in FIG. 4(a-d) are the calculated RF fields within the cylindrical imaging space 11 with a 68 mm diameter. FIG. 4(a) is the calculated RF field corresponding to volumetric trough-shaped coil element 16. FIG. 4(b) is the calculated RF field corresponding to volumetric trough-shaped coil element 17. FIG. 4(c) is the calculated RF field corresponding to the volumetric trough-shaped coil element 18 and FIG. 4(d) is the calculated RF field corresponding to volumetric trough-shaped coil element 19.

Figure 5:
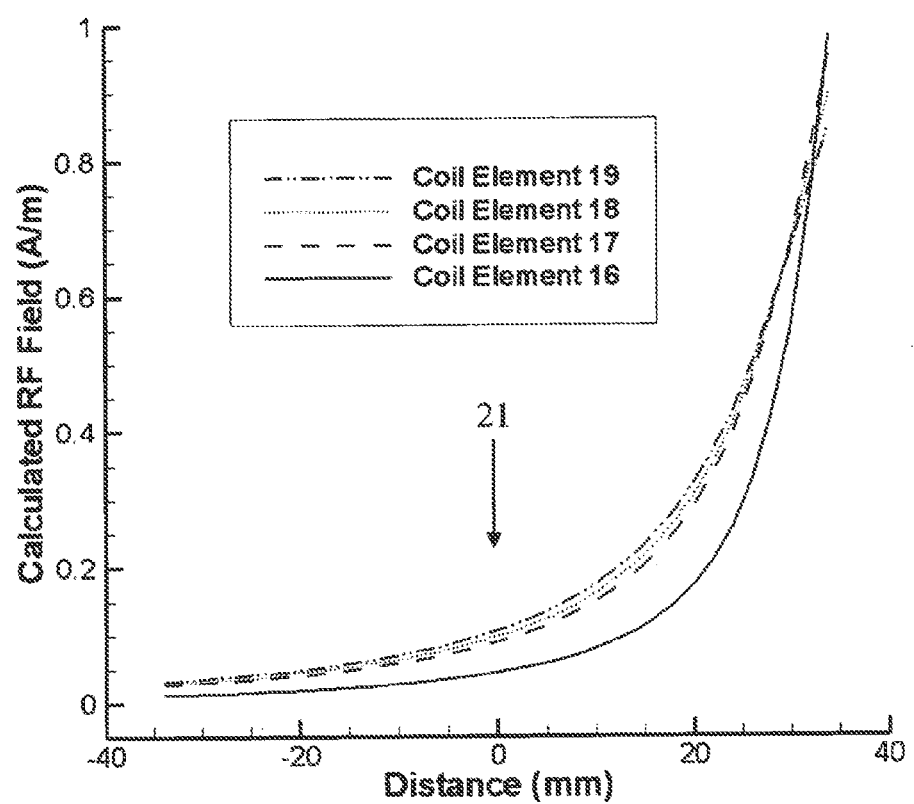
FIG. 5 shows a 1D data plot of the calculated RF fields taken along the dotted white lines of FIG. 4(a-d).

To further exemplify the embodiment, sensitivity data taken along the dotted white lines 20 of FIG. 4(a-d) are extracted and plotted. Shown in FIG. 5 is the plot of these collected 1D RF field data. At the distance of 0 mm 21, which corresponds to the centre of the cylindrical imaging space 11, there is evidently an increase in the RF field whenever the long side of the radiating structures are angularly oriented. For volumetric trough-shaped coil element 16 the calculated RF field at 21 is approximately 0.0445 A/m as compared volumetric trough-shaped to coil element 17 of 0.0895 A/m, volumetric trough-shaped coil element 18 of 0.0972 A/m and volumetric trough-shaped coil element 19 of 0.1061 A/m. The percentage of increment of the RF field with volumetric trough-shaped coil elements 17, 18, 19 compared to the conventional type of coil element 16 are approximately 101%, 118% and 138% respectively.

A further advantage of the invention is that it can reduce the capacitive coupling between the RF system and the sample. Referring to FIG. 1 and FIG. 3, if coil 16 is used in place of the volumetric trough-shaped coil elements shown in FIG. 1, the surface area of the radiating structure exposed to the sample 14 will be far greater than that of coil 17, 18 and 19. As a result, the capacitive coupling of coil 16 will be greater. Therefore, by orienting the radiating structures at an angle to a tangent of the cylindrical imaging space 11, the capacitive coupling between the RF system and the sample can be minimised and beneficially increase the Q factor which thereby increases the signal-to-noise ration (SNR) of the RF system. It will also balance the RF system, drastically reducing the adverse detuning effect of the RF system when various sized samples are used. This effectively reduces the need to perform re-tuning for different sized samples. In addition, the change in mutual coupling between coil elements will not be drastic, thus the decoupling system will still efficiently perform mutual decoupling.

Regulating Mutual Coupling

The invention has the advantageous feature of being able to regulate the amount of mutual coupling between neighbouring volumetric trough-shaped coil elements. If mutual coupling can be reduced before the implementation of any decoupling methods, it will increase the efficiency of the decoupling methods, allowing mutual coupling to be easily minimised and importantly achieving a higher decoupling power. Persons skilled in the art will appreciate and understand that it will certainly simplify the design and construction of any multi-element RF coil if the mutual coupling between neighbouring volumetric trough-shaped coil elements is small.

To demonstrate that the invention can regulate the amount of mutual coupling, mutual coupling between two radiating structures of volumetric trough-shaped coil elements 27, 28, 29, as shown in FIG. 6, are calculated. Each volumetric trough-shaped coil element, such as 27, consists of two sub-elements such as 270, which in turn is constructed from two radiating structures 271. The angle between the radiating structures within a sub-element is 45° and the angle between the sub-elements is as described previously with volumetric trough-shaped coil element 27 having the same angle as volumetric trough-shaped coil element 17, volumetric trough-shaped coil element 28 having the same angle as volumetric trough-shaped coil element 18 and volumetric trough-shaped coil element 29 having the same angle as volumetric trough-shaped coil element 19 (62.5°, 85° and 95° respectively).

Figure 7A:
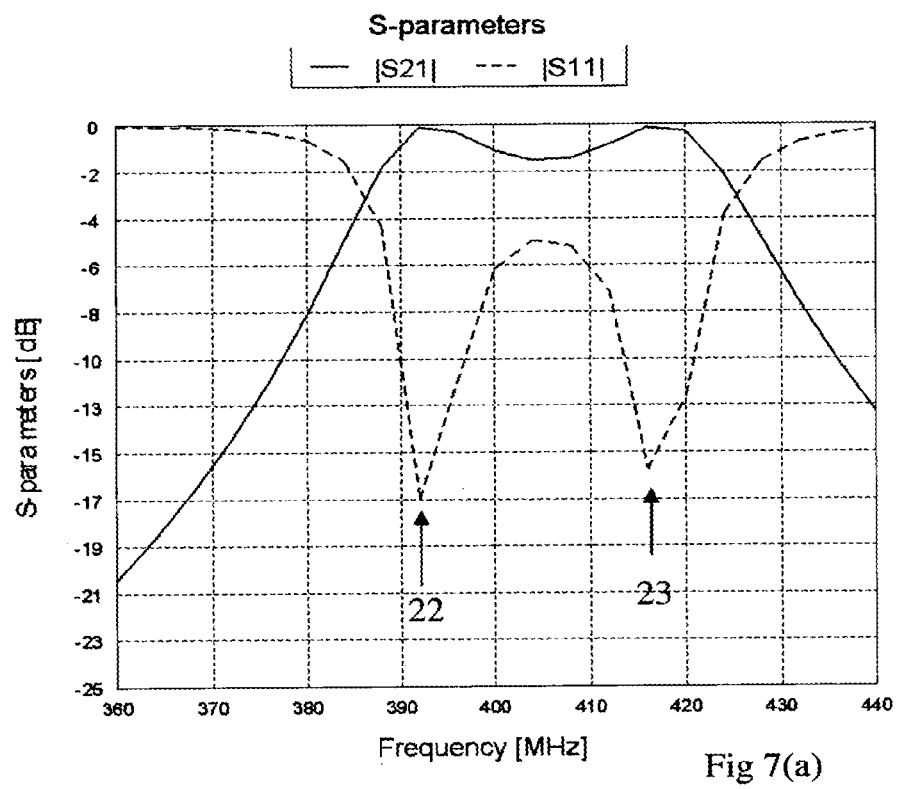
FIG. 7 (a-c) shows the calculated $S_{11}$ and $S_{21}$ responses for the volumetric trough-shaped coil sub-elements of FIG. 6(a-c) respectively.
Figure 7B:
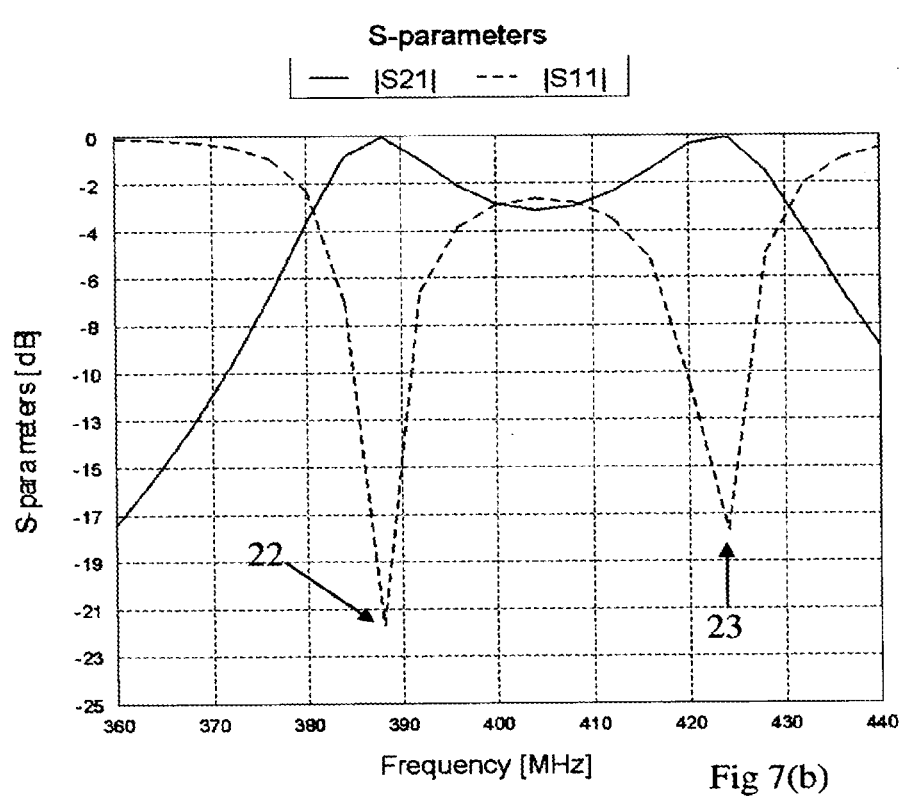
Figure 7C:
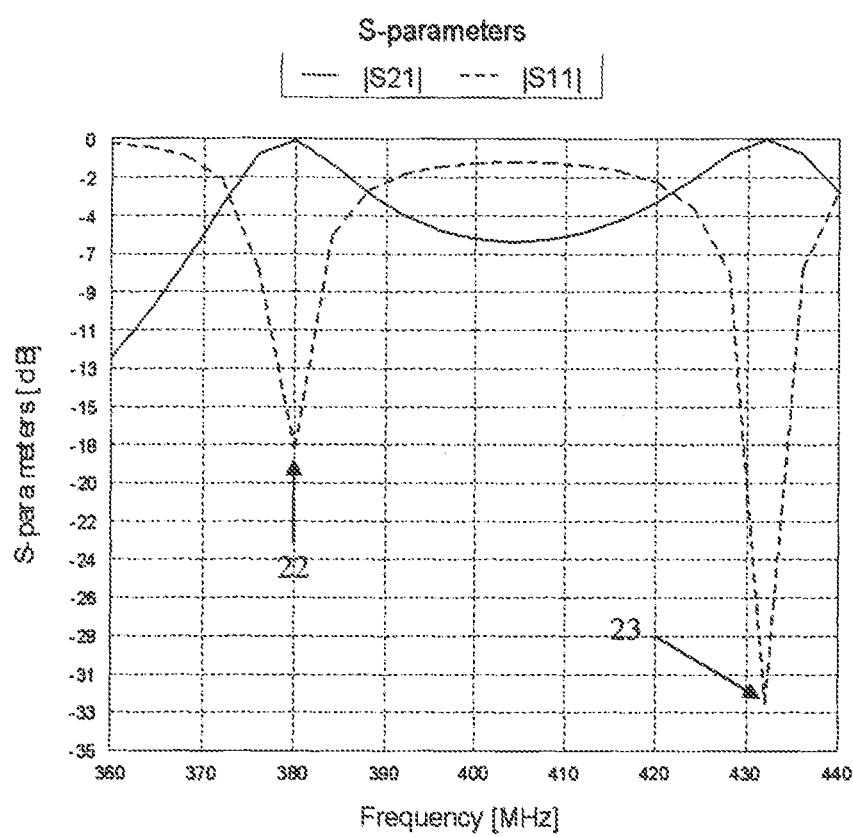

Mutual coupling between two volumetric trough-shaped coil elements causes dual minimums 22, 23 or a 'splitting' of the resonance frequency, as shown in FIG. 7(a-c) and explained in U.S. Pat. No. 4,825,162. The apparent 'splitting' effect is evidently shown in the calculated $S_{11}$ and $S_{21}$ responses for two coil sub-elements 270 (see FIG. 7(a)), 280 (see FIG. 7(b)) and 290 (see FIG. 7(c)). In addition, with different orientation of the long side radiating structures, the amount of mutual coupling can be regulated. In this instance, FIG. 7(a) which corresponds to coil sub-elements 270 has the least mutual coupling as compared to the other two structured coil sub-elements 280, 290 (FIGS. 7(b) and (c)). Those skilled in the art will understand that with stronger mutual coupling, the larger the 'splitting' that will appear.

Demonstration

To demonstrate that the invention can increase the RF field and regulate mutual coupling, a 9.4T shielded 8-element parallel transceive RF coil, as shown in FIG. 1, for pre-clinical MRI application was designed and built, using the invention. Hybrid MoM/FEM is used for modelling the RF coil. Each volumetric trough-shaped coil element has its long side radiating structures oriented with a tangential angle of about 62.5°, which is optimised using a full-wave FDTD method. Taking into account the space constraint in which the 8-element coil will be housed, the amount of mutual coupling the counter wound inductor decoupling method 10 employed here can easily and successfully perform mutual decoupling and the amount of RF field that can be increased in the centre of the cylindrical phantom 14 by orienting to this angle. The tangential angle is not limited to 62.5° and for different types of multi-element RF coils the orientation angle will change accordingly, in order to gain maximum advantage.

Once each volumetric trough-shaped coil element is tuned to 400 MHz, matched to system impedance of 50Ω and mutually decoupled, the magnetic fields inside the cylindrical phantom 14 with an axial plane (xy plane) profile, located at the mid section, are calculated. The magnetic field profiles are calculated by exciting the transceive RF coil in a birdcage-like excitation mode, that is, all volumetric trough-shaped coil elements are excited with similar voltage amplitude but having phases with an increment of 45°. Following the principle of reciprocity [Hoult, Concepts Magn Reson 12(4) pg 173-187, 2000], the transmission fields $\hat{B}_{1t}^+$ and reception fields $\hat{B}_{1r}^-$ can then be calculated by $$\hat{B}_{1t}^+ = \frac{(\hat{B}_x + i\hat{B}_y)}{2} \quad [1]$$

$$\hat{B}_{1r}^- = \frac{(\hat{B}_x - i\hat{B}_y)^*}{2} \quad [2]$$

where $\hat{B}_x$, $\hat{B}_y$ are the two orthogonal components of the complex magnetic fields calculated by the hybrid MoM/FEM method; an asterisk denotes a complex conjugate. The transmission and reception $B_1$ fields are obtained by solving Eqs [1] and [2].

With the RF profiles calculated by the hybrid MoM/FEM algorithm, the MR images for a cylindrical phantom can then be simulated and compared with the one acquired in parallel using the constructed prototype shown in the results section.

Prototype

A prototype of the shielded 8-element transceive RF coil 24 was constructed and is shown in FIG. 8(a). Each volumetric trough-shaped coil element has its long side radiating structure 13 oriented to 62.5° as show in FIG. 8(b). The prototype is constructed in structure and dimensions according to the modelled transceive RF coil 15 as shown in FIG. 1. Note that RF shielding is not shown here.

The invention permits the distributed inductance and capacitance of the radiating structure to be adjusted, allowing the multi-element transceive RF coil to be used at ultra-high field strength. This is important for ultra-high frequency RF coils, in cases where the desired capacitors are not commercially available. To achieve these adjustments, part of the copper strip on the top-side of the long side radiating structure is removed, forming a gap 25 as shown in FIG. 8(c). This is analogous to a lumped-circuit consisting of virtual inductors and capacitors placed in series as shown in FIG. 8(d) whereby the length and width of the copper strips, and the thickness and electrical proprieties of the dielectric between the top and under-side copper strips determine the inductance and the capacitance. Thus, by varying the number and dimension of gap 25 to be used, it is possible to adjust the inductance and capacitance.

Results

Figures 9E, 9F, 9G, 9H:
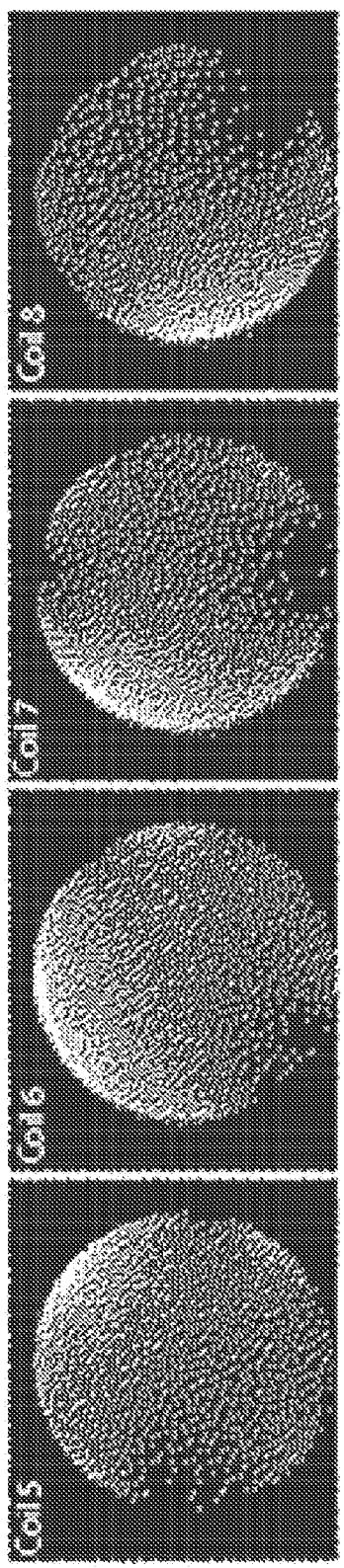
FIG. 9 (a-h) shows the sensitivity profiles corresponding to each volumetric trough-shaped coil element.

The prototype 24 was tested in a Bruker 9.4T Avance III spectrometer MRI system with 8 transmit and receive channels. Four MRI experiments were undertaken to test the prototype. The first experiment is to obtain the sensitivity profile of each volumetric trough-shaped coil element. The prototype is loaded with a cylindrical phantom having the same dimensions and dielectric properties as the modelled cylindrical phantom 14 and one volumetric trough-shaped coil element is used for the transmission of the $B_1$ field at any one time while all eight elements are used for the parallel reception of the excited MR signal. Shown in FIG. 9 (a-h) are the eight sensitivity profiles corresponding to each volumetric trough-shaped coil element.

Figure 10A:
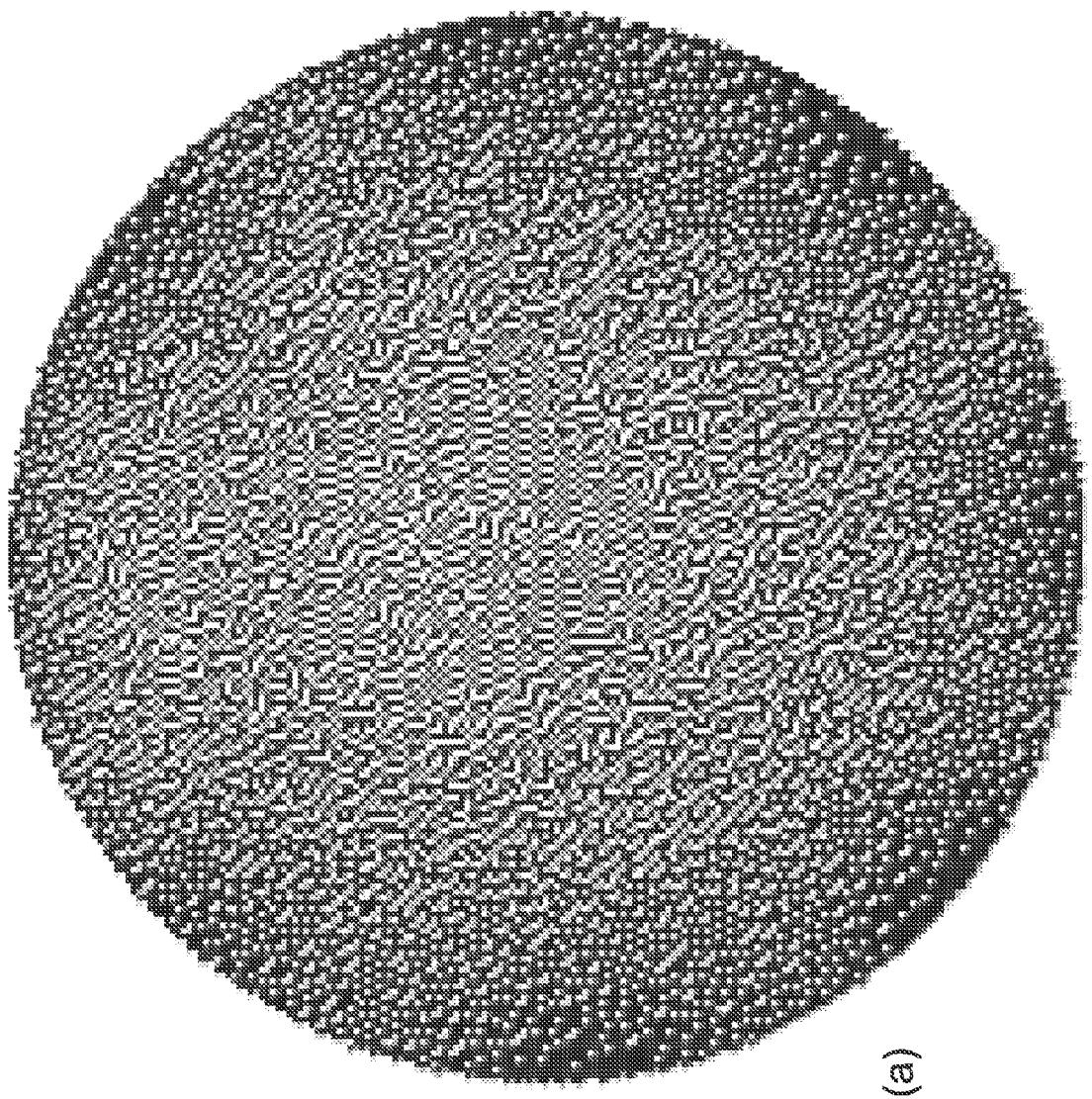
FIG. 10 shows (a) the obtained MR image and (b) the hybrid MoM/FEM simulated results.
Figure 10B:
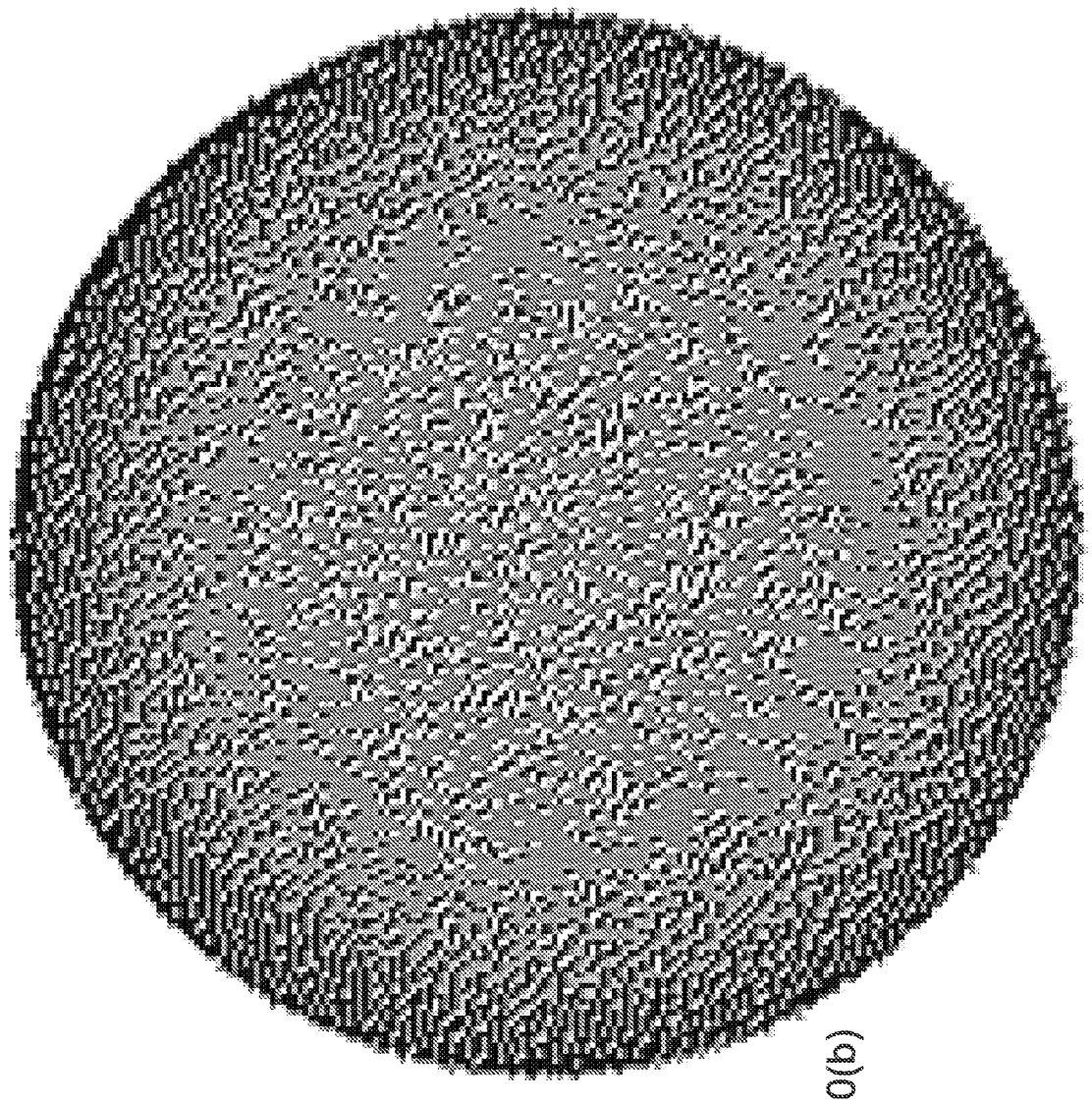

In the second experiment, all volumetric trough-shaped coil elements of the prototype 24 loaded with a cylindrical phantom are simultaneously used for the transmission of the $B_1$ field and concurrently used for the parallel reception of the excited MR signal. This shows the homogeneity of the RF field that can be obtained using the prototype 24 at ultra-high field. For the transmission of the $B_1$ field, volumetric trough-shaped coil elements are excited in a birdcage-like excitation mode, similar to how it is excited in the simulation as discussed earlier. The parallel received MR signals are thereafter combined using a sum-of-square method, forming a composite image of the cylindrical phantom. Shown in FIG. 10(a) is the obtained MR image while FIG. 10(b) is the hybrid MoM/FEM simulated results.

Figure 11:
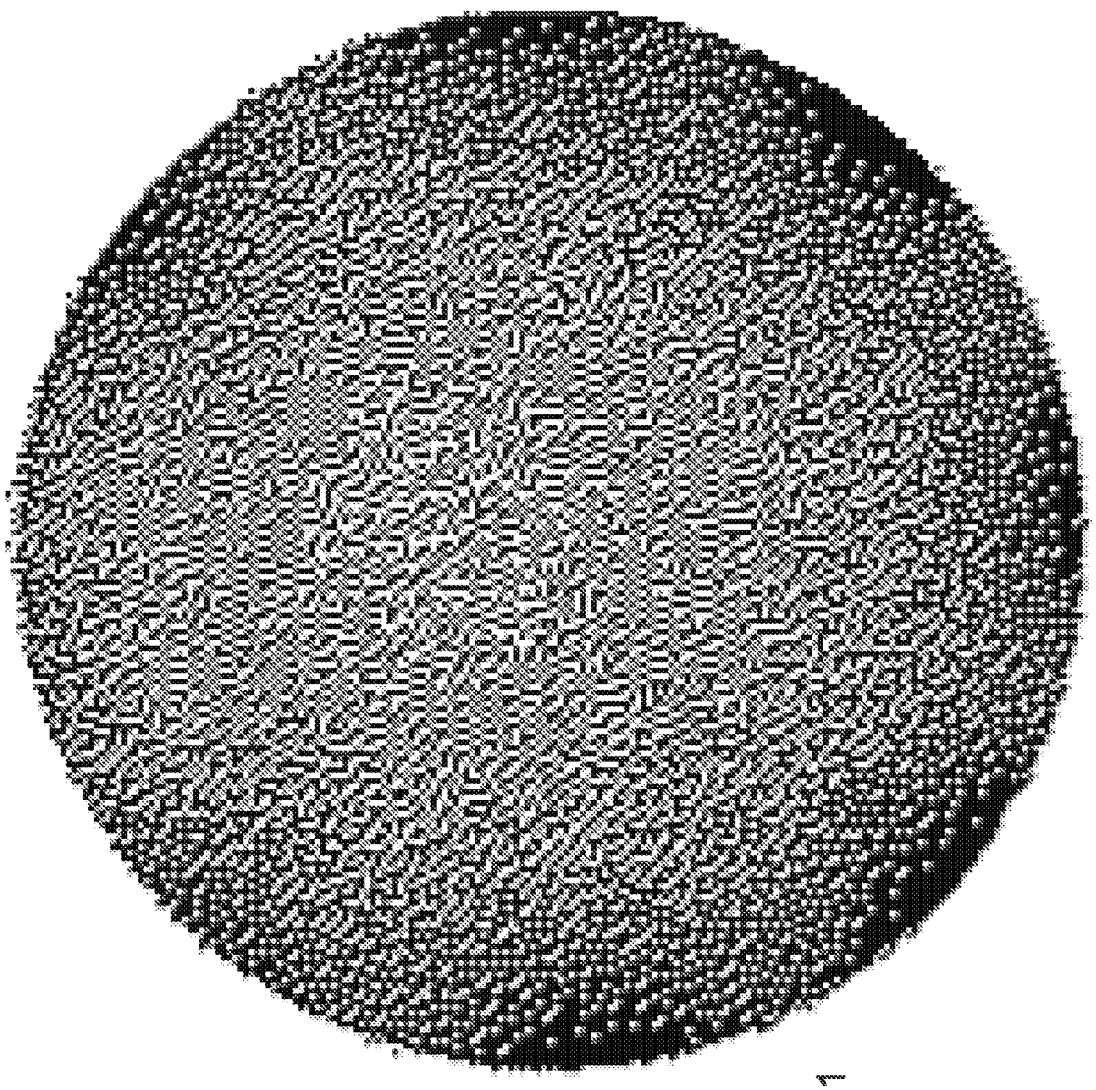
FIG. 11 shows a GRAPPA reconstructed image of the cylindrical phantom with a reduction factor of 2.

For the third experiment, the suitability of the prototype 24 for partial parallel imaging purposes is investigated. A GRAPPA parallel imaging reconstruction method with a reduction factor of 2 is applied to demonstrate parallel imaging is well suited and compliments the 8-element transceive RF coil designed using the invention. Detailed explanation on the operation of GRAPPA had been reported [Griswold et al, Magn Reson Med 47(6) pg 1202-1210, 2002]. Similar to the second experiment, all volumetric trough-shaped coil elements of the prototype 24 loaded with a cylindrical phantom are simultaneously excited in a birdcage-like excitation mode to transmit the required $B_1$ field; however, during the parallel reception of the MR signal, every even numbered phase encoding data are not acquired. These missing data are reconstructed using GRAPPA. Shown in FIG. 11 is the GRAPPA reconstructed image of the cylindrical phantom with a reduction factor of 2.

Figure 12A:
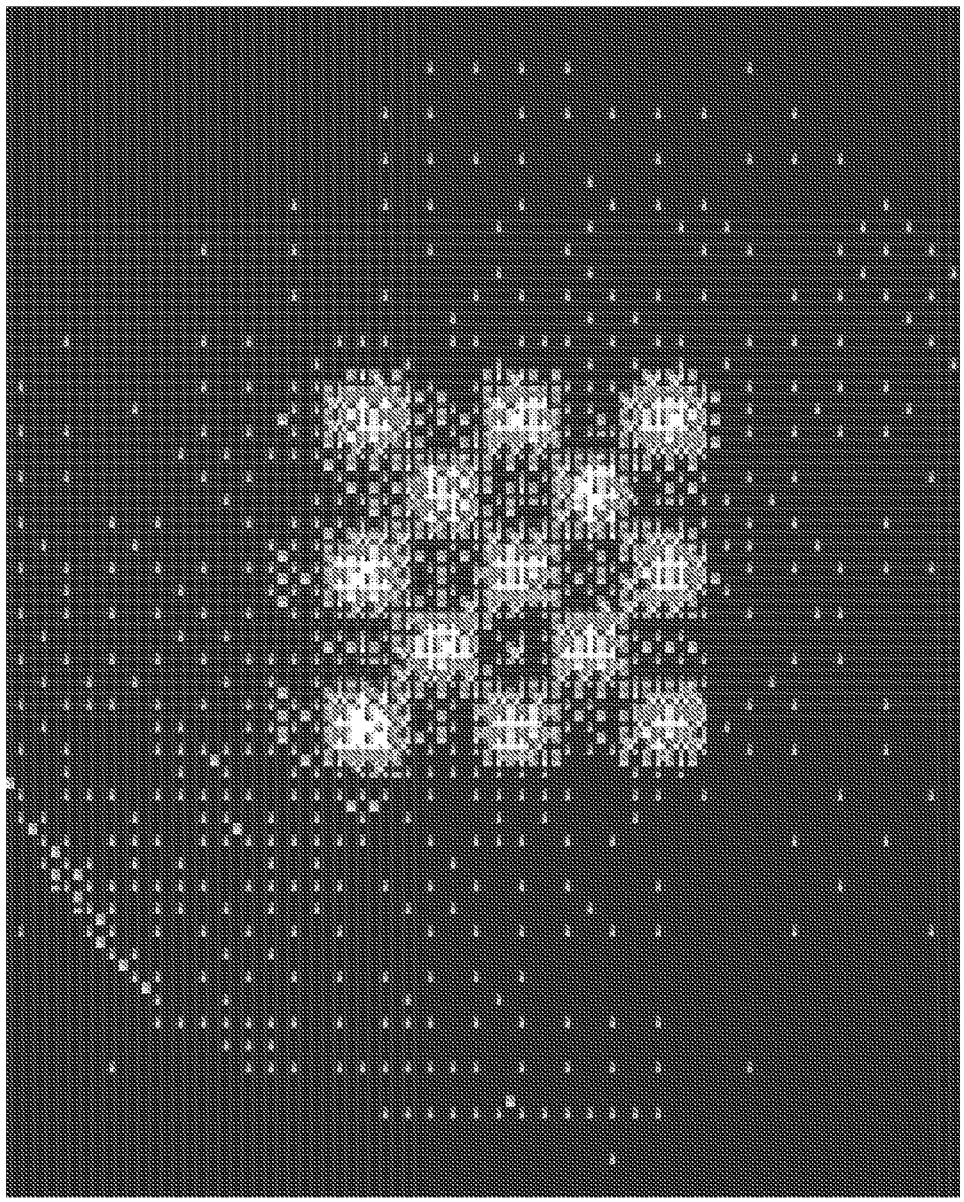
FIG. 12(a-b) shows the chequerboard target pattern using Transmit SENSE. (a) Transmit SENSE with an acceleration factor of two and (b) an acceleration factor of four.
Figure 12B:
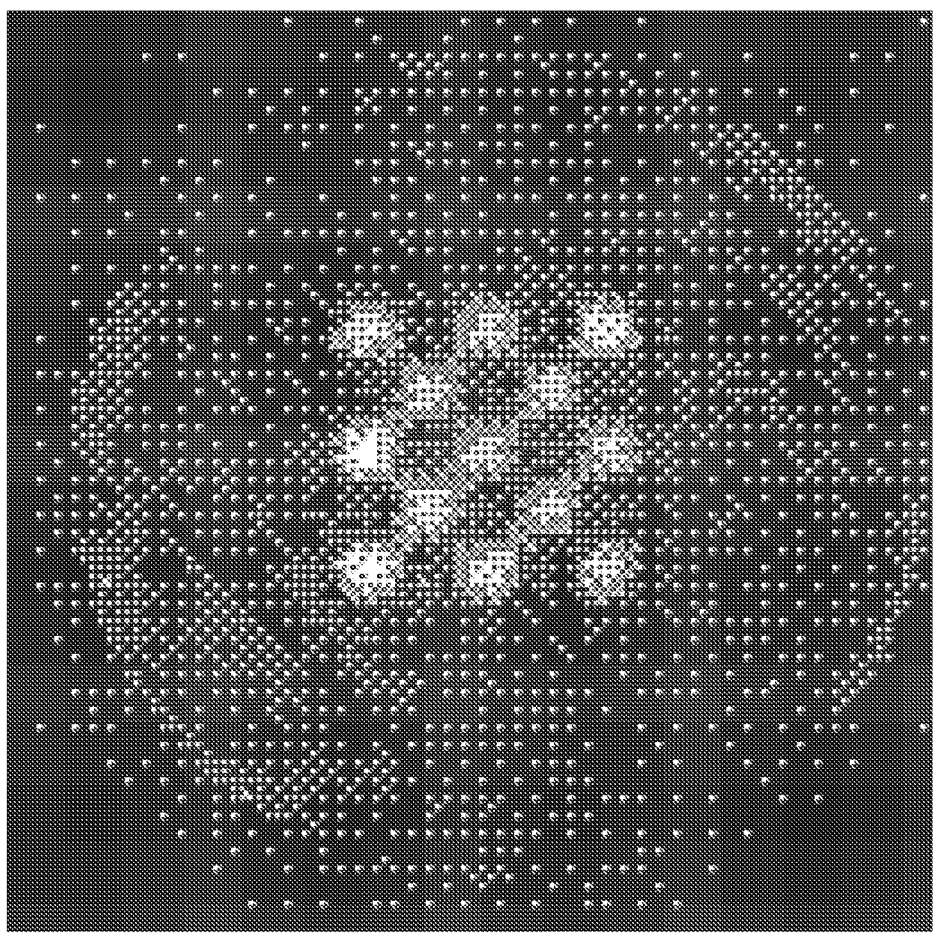
Figure 13A:
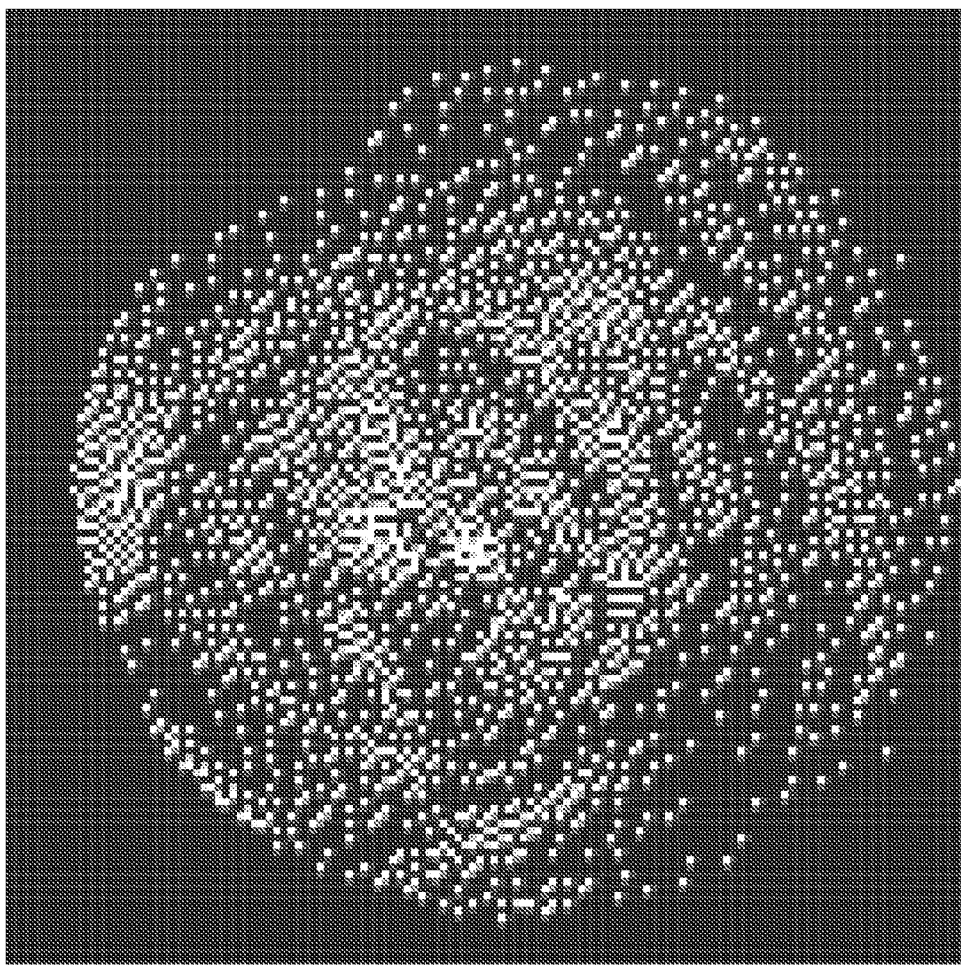
FIG. 13(a-h) show the images with each volumetric trough-shaped coil element transmitting, in succession, the spatially selective pulses of the chequerboard pattern with an acceleration factor of four.
Figure 13B:
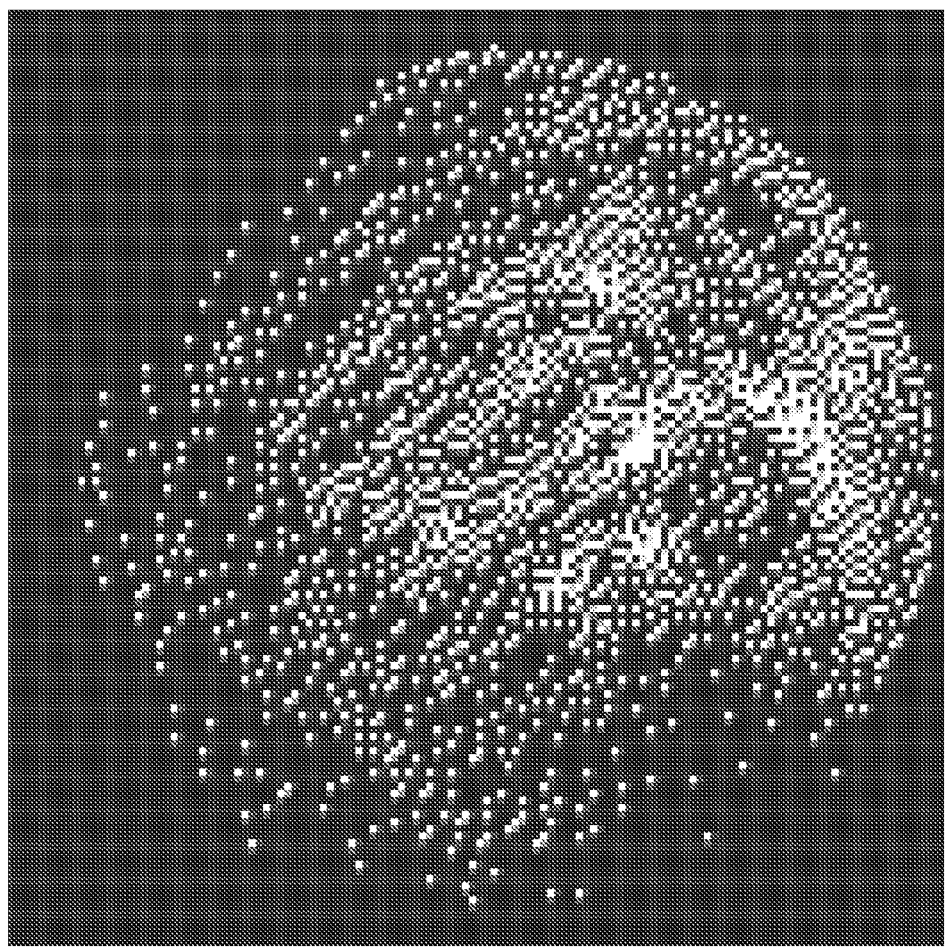
Figure 13C:
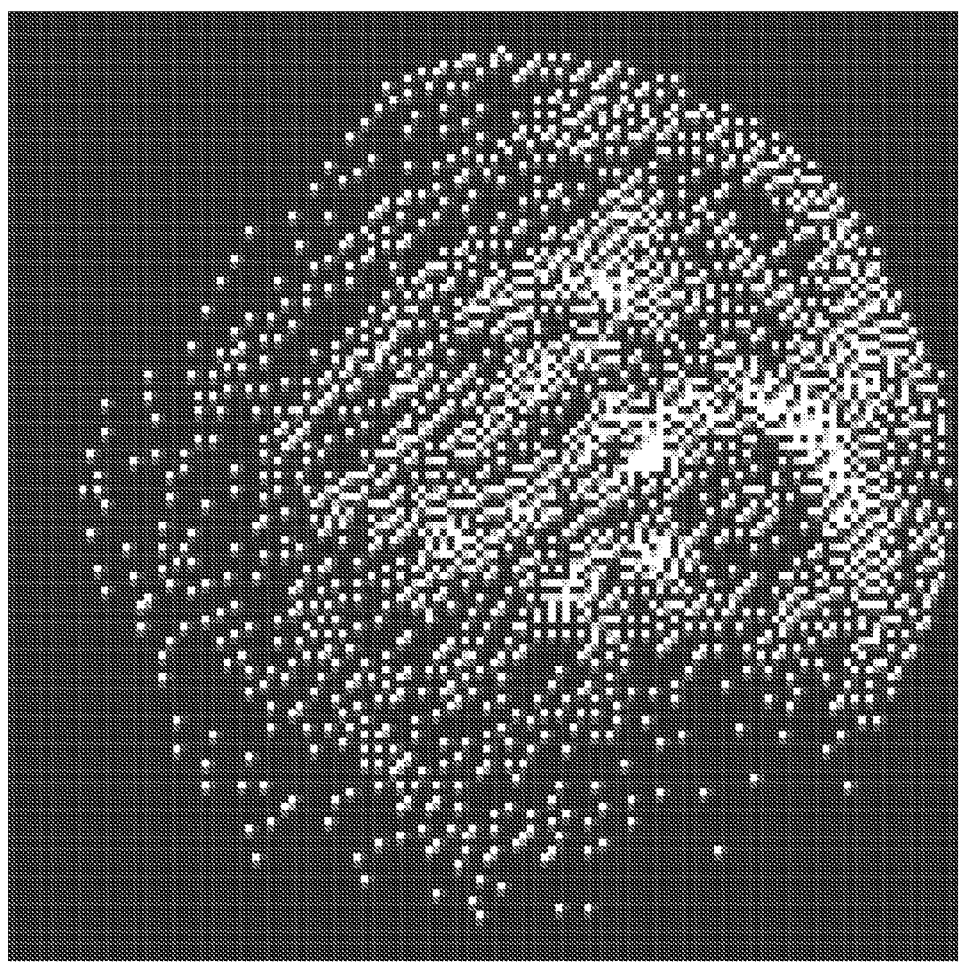
Figure 13D:
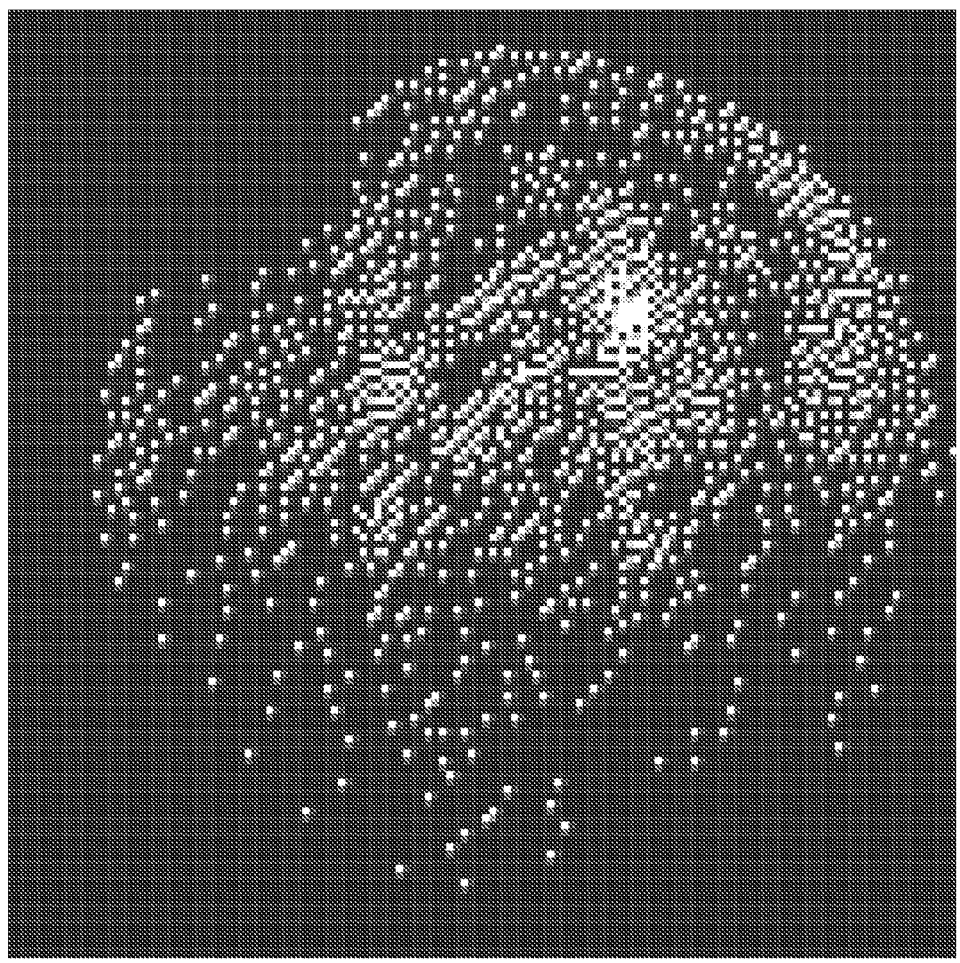
Figure 13E:
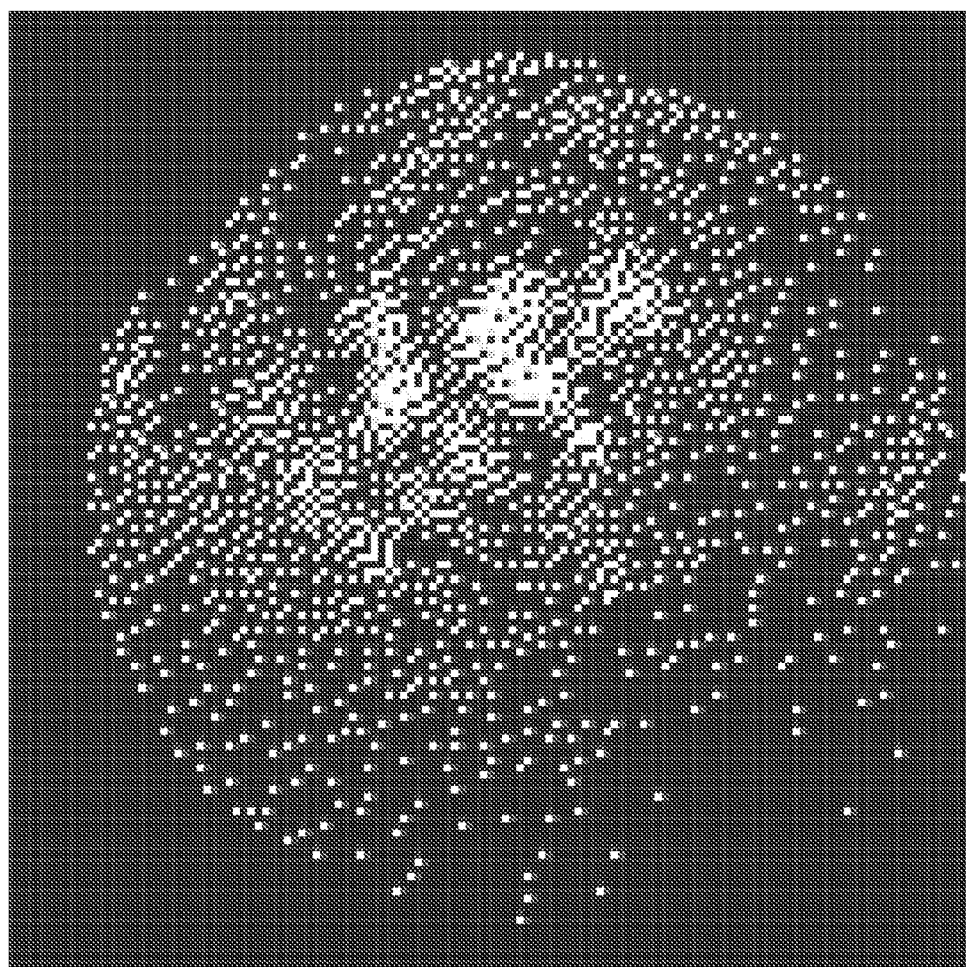
Figure 13F:
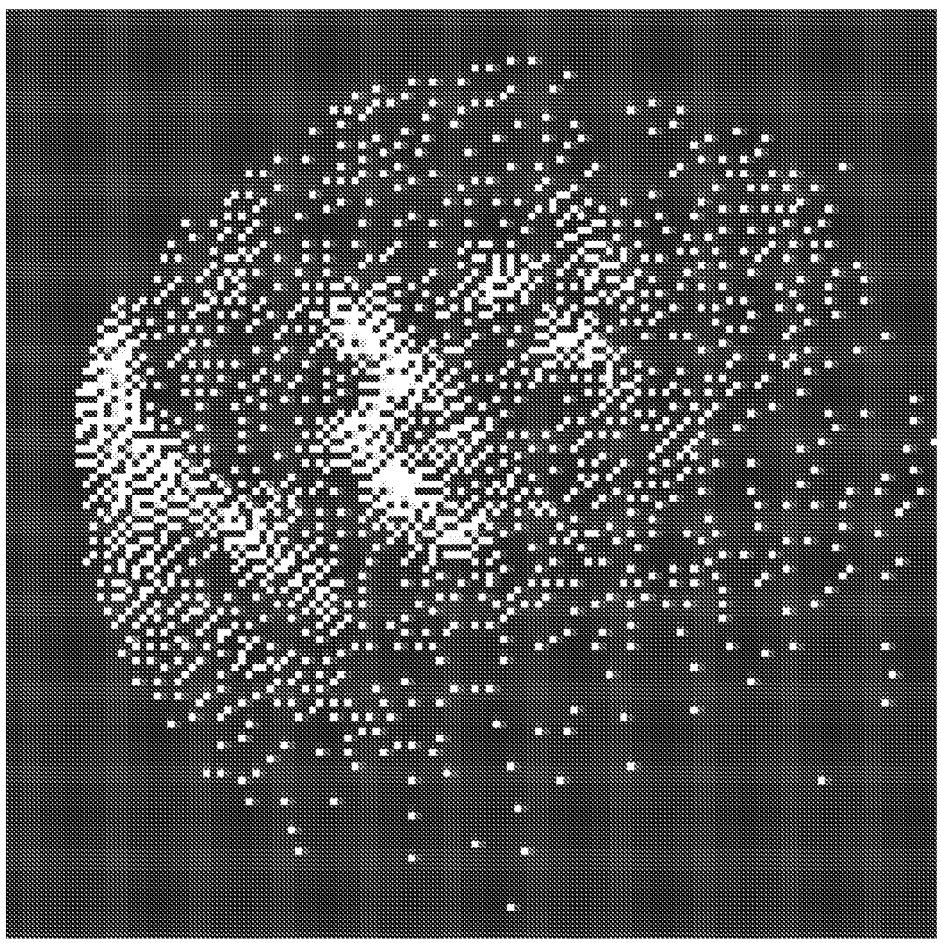
Figure 13G:
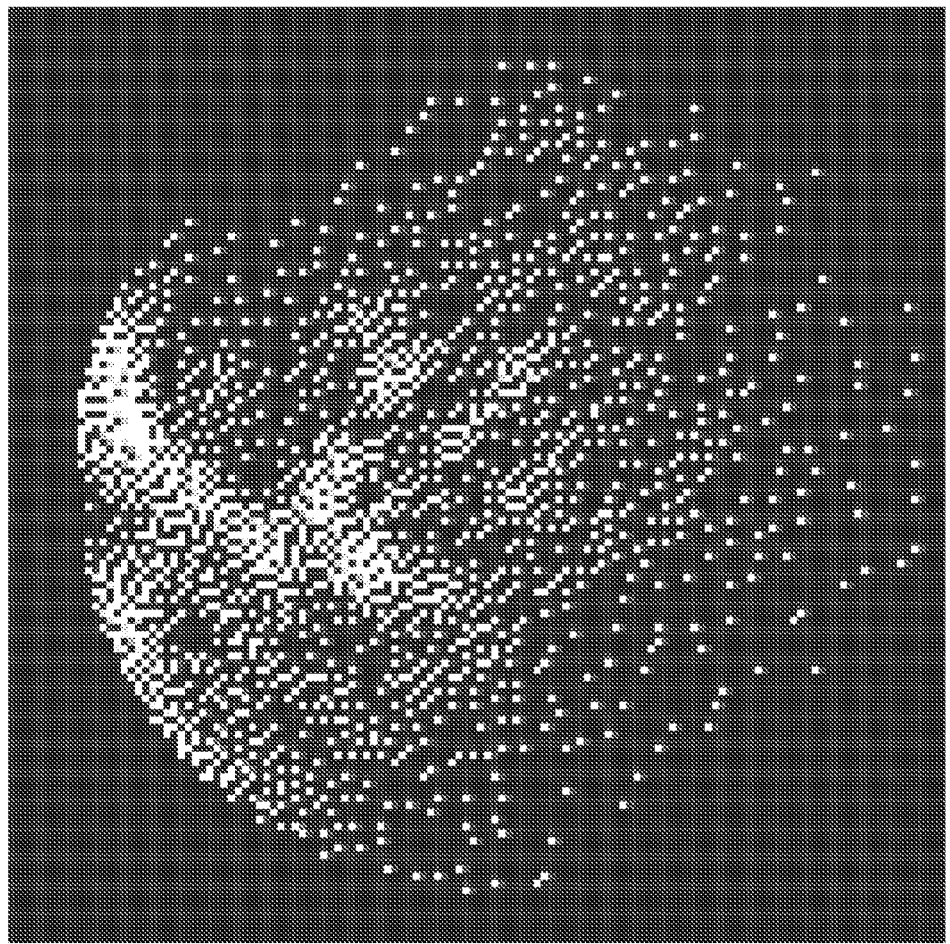
Figure 13H:
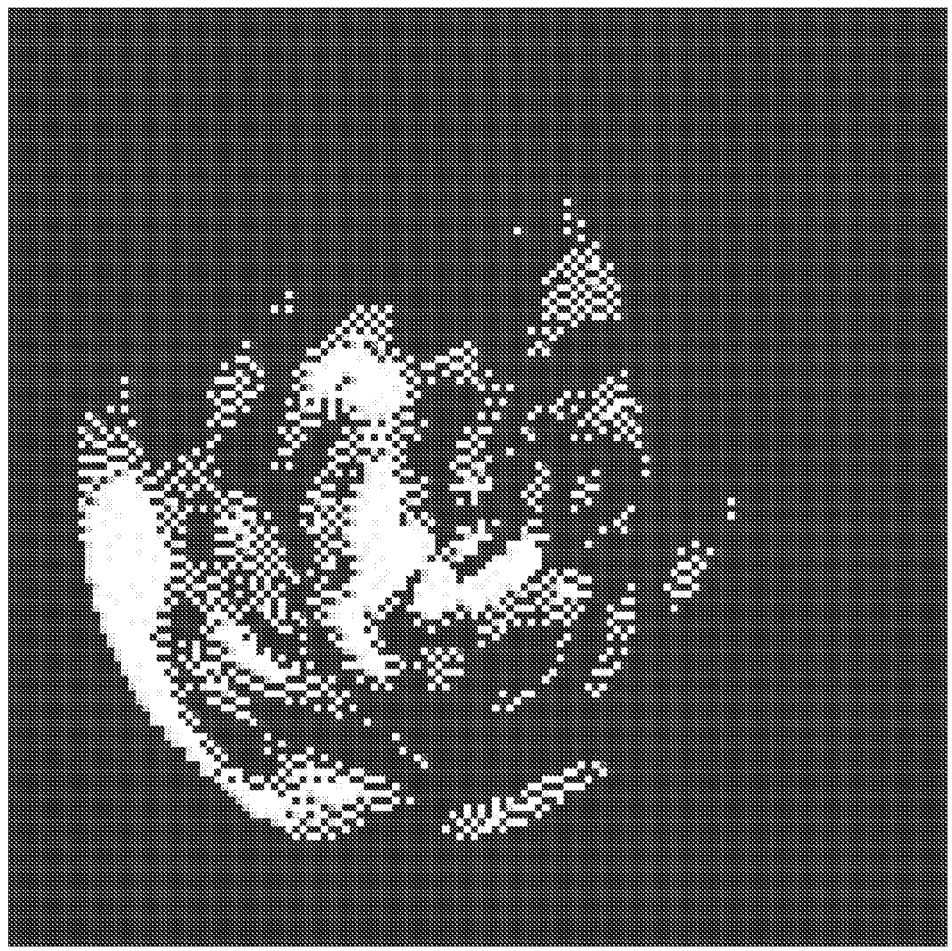

For the fourth experiment, the prototype is tested for suitability for Transmit SENSE application. A chequerboard target pattern has been selected. Shown in FIG. 12(a) is the parallel excitation of the chequerboard target pattern with a spiral k-space trajectory and an acceleration factor of 2 while for FIG. 12(b) the acceleration factor is increased to 4.

Shown in FIG. 13(a-h) are images of each volumetric trough-shaped coil element transmitting, in succession, the spatially selective pulses of the chequerboard pattern with an acceleration factor of 4. From these images, it can be seen that the RF inhomogeneity effect has been significantly reduced and the under-sampling artefacts vanish when parallel transmission (FIG. 12(b)) is applied.

Figure 14:
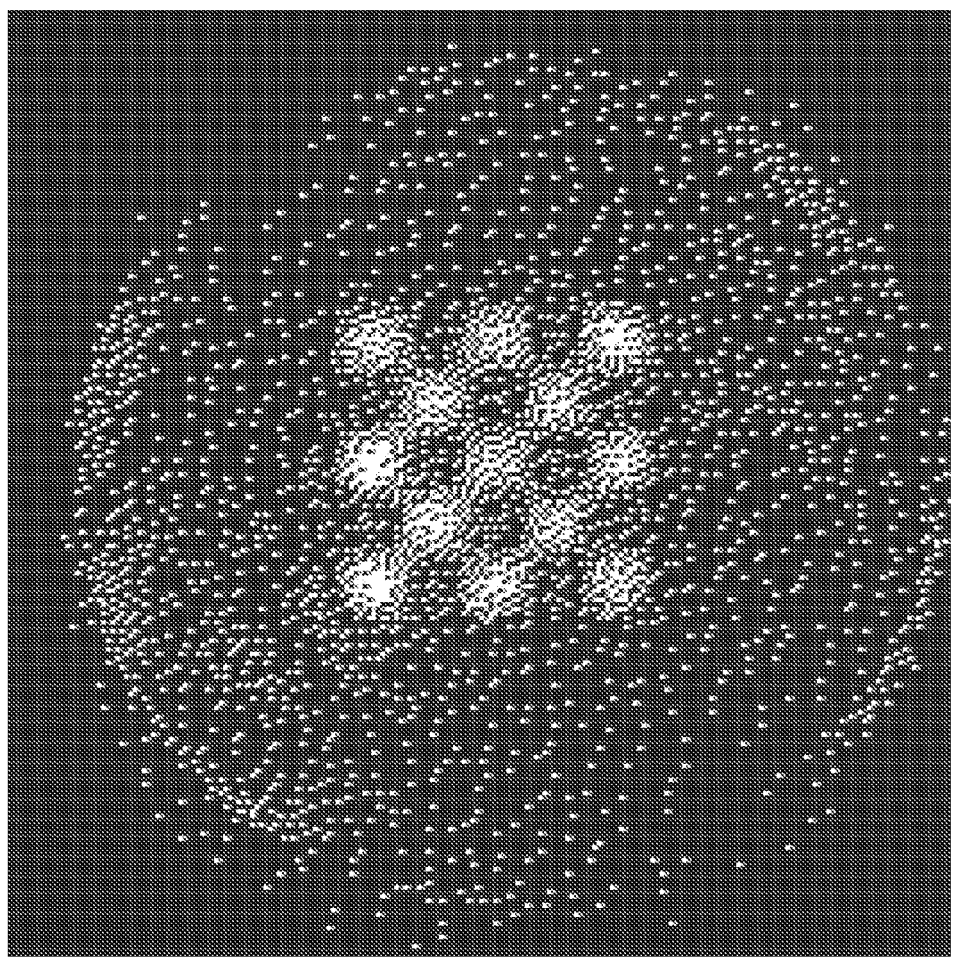
FIG. 14 shows the complex numerical combined image of FIG. 13(a-h).

FIG. 14 is the complex numerical combination of the images of FIG. 13(a-h). In comparing FIG. 14 and FIG. 12(b), the numerical combination shows an excellent correspondence to the actual parallel excitation, which is an indication that the prototype is able to synchronously transmit individual spatially selective RF pulses on each volumetric trough-shaped coil element with high accuracy.

Further Embodiments

Figure 15:
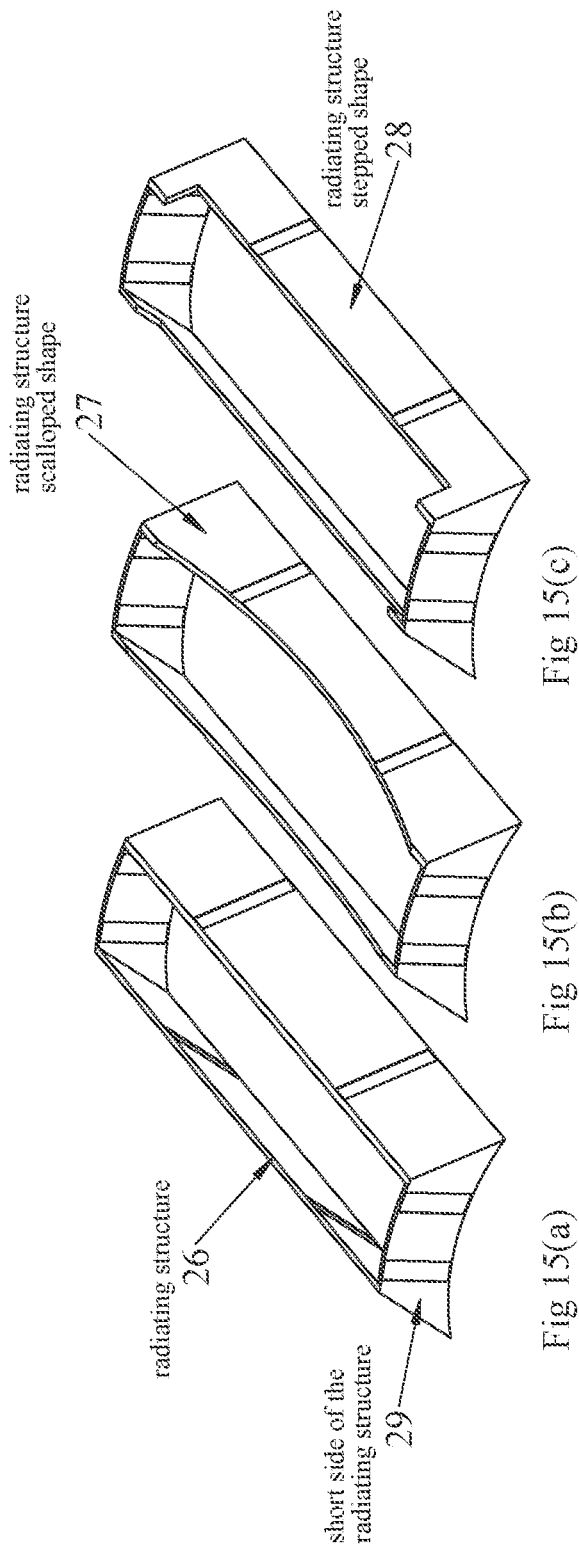

As mentioned above, the radiating elements need not be rectangular. FIG. 15 demonstrates other embodiments of the invention. FIG. 15(a) shows a coil similar to the preferred embodiment of FIG. 8 with previously described radiating structure 26. FIG. 15(b) shows a variation in which the radiating structure 27 has a scalloped shape. A further variation is shown in FIG. 15(c) where the radiating structure 28 has a stepped shape. Persons skilled in the art will appreciate that the short side radiating structures 30 may also have different shapes.

Various other shapes are also possible for the radiating structures as shown in FIG. 16. FIG. 16(a) shows a coil similar to the preferred embodiment of FIG. 8 but from a different angle. For ease of viewing a single radiating structure 30 is shown in FIG. 16(b). FIG. 16(c) shows a radiating structure 31 having an I' shape. A curved radiating structure 32 is shown in FIG. 16(d). Persons skilled in the art will appreciate that the curve may be concave or convex.

The embodiments of FIGS. 16 (c) and (d) demonstrate variation on the short axis of the radiating structure but there can also be variation on the long axis. Radiating structure 33 in FIG. 16(e) shows an irregular shape and FIG. 16(f) shows a radiating structure 34 that is curved along the long axis. Each of these embodiments may find specific application in certain circumstances.

The embodiments of FIG. 15 and FIG. 16 demonstrate that the radiating structures may have different shapes including curves and bends. The construction of the radiating structures may also be varied. FIG. 17(a) shows an end view of a coil similar to the preferred embodiment of FIG. 8. Although not shown in earlier embodiments the radiating structure 35 is built onto a fixed width printed circuit board, shown in the lower part of FIG. 17(b). The printed circuit board is constructed on a dielectric substrate 36 around which conductive material (usually copper) is wound. The shape of the radiating structure is determined by the shape of the dielectric substrate. FIG. 17(c) displays a radiating structure 37 built on a dielectric substrate 38 that has an elongate diamond shape. As shown in FIG. 17(d) the dielectric substrate 40 can have a compound straight and curved shape to produce a radiating structure 39 of the same shape. The radiating structure 41 of FIG. 17(e) demonstrates a further shape that can be achieved from the dielectric substrate 42.

SUMMARY

The invention disclosed herein shows that a dedicated layout of the volumetric trough-shaped coil element structure relative to the sample and the shielding can maximise the RF field and reduce the mutual coupling effect. It can also reduce the capacitive coupling between the coils and the sample.

The invention is not limited to only orienting the long side radiating structure as demonstrated herein. Depending on the applications and importantly the advantages that one desires to gain from this invention, there are no bounded constraints in orienting any side or sides of the radiating structure and the angle to which it is oriented for dense array systems.

It will be appreciated that the embodiments described above utilizes eight transceive RF coils but the invention is not limited to such an arrangement or number of coils and can, without any limitations, be applied to the design of transmit and/or receive multi-element planar coil arrays or volumetric type of RF systems.

It will further be appreciated that the invention complements the applications of partial parallel imaging and accelerated spatially selective excitation.

Throughout the specification, the aim has been to describe the invention without limiting the invention to any particular combination of alternate features or any particular applications it can be implemented to.

The invention claimed is:

1. A transmit and/or receive radio frequency coil, the coil comprising:
   an RF field generator, said RF field generator generating an RF field within a substantially cylindrical measuring space, said RF field generator comprising:
      a plurality of volumetric trough-shaped coil elements, enclosing said cylindrical measuring space,
      each volumetric trough-shaped coil element having, as part of its structure, two oppositely spaced apart, elongated radiating structures and two end elements connected between facing ends of said elongated radiating structures, with each end element generating capacitive coupling between said two radiating structures,
      said capacitive coupling being selected in order to tune each volumetric trough-shaped coil element to a desired resonant frequency and impedance,
      wherein each radiating structure is aligned at an angle α relative to a tangent of said cylindrical measuring space, said angle α being selected in order to increase an RF field at a center of said cylindrical measuring space and in order to regulate a mutual decoupling between neighbouring volumetric trough-shaped coil elements; and
      a plurality of counter wound inductors disposed between adjacent volumetric trough-shaped coil elements in order to mutually decouple said volumetric trough-shaped coil elements from each other.

2. The transmit and/or receive radio frequency coil of claim 1, wherein the coil is a magnetic resonance imaging coil.

3. The transmit and/or receive radio frequency coil of claim 1,
   wherein said volumetric trough-shaped coil elements are arranged around a circumference of said cylindrical measuring space with a spacing between volumetric trough-shaped coil elements of 360°/N, where N is the number of coil elements.

4. The transmit and/or receive radio frequency coil of claim 1,
   wherein said elongated radiating structures are rectangular.

5. The transmit and/or receive radio frequency coil of claim 4, wherein a long side of said rectangular elongated radiating structures is a parallel to a longitudinal axis of said cylindrical measuring space.

6. The transmit and/or receive radio frequency coil of claim 1,
   wherein each volumetric trough-shaped coil element has inductance and capacitance elements that are incorporated into each volumetric trough-shaped coil element.

7. The transmit and/or receive radio frequency coil of claim 6,
   wherein said inductance and capacitance elements are oriented at an angle in order to enhance radio frequency field penetration into said cylindrical measuring space.

8. The transmit and/or receive radio frequency coil of claim 1,
   wherein each of said radiating structures has a form of a bent or curved shape.

9. The transmit and/or receive radio frequency coil of claim 1, wherein each of said radiating structures is constructed on a dielectric substrate, with said dielectric substrate having a form of a bent and/or curved shape.

10. The transmit and/or receive radio frequency coil of claim 3, wherein N=8.

11. The transmit and/or receive radio frequency coil of claim 1, wherein $62.5°\leq\alpha\leq95°$.

* * * * *